(12) United States Patent
Fukui et al.

(10) Patent No.: US 12,444,667 B2
(45) Date of Patent: Oct. 14, 2025

(54) SEMICONDUCTOR DEVICE AND METHOD FOR MANUFACTURING SEMICONDUCTOR DEVICE

(71) Applicants: ASE JAPAN CO., LTD., Yamagata (JP); ROHM CO., LTD., Kyoto (JP)

(72) Inventors: Susumu Fukui, Yamagata (JP); Takaki Takahashi, Yamagata (JP); Kanako Deguchi, Kyoto (JP); Kentaro Nasu, Kyoto (JP)

(73) Assignees: ROHM CO., LTD., Kyoto (JP); ASE JAPAN CO., LTD., Yamagata (JP)

( * ) Notice: Subject to any disclaimer, the term of this patent is extended or adjusted under 35 U.S.C. 154(b) by 606 days.

(21) Appl. No.: 17/425,212

(22) PCT Filed: Feb. 7, 2020

(86) PCT No.: PCT/JP2020/004860
§ 371 (c)(1),
(2) Date: Jul. 22, 2021

(87) PCT Pub. No.: WO2020/166512
PCT Pub. Date: Aug. 20, 2020

(65) Prior Publication Data
US 2022/0084912 A1    Mar. 17, 2022

(30) Foreign Application Priority Data
Feb. 15, 2019 (JP) .................... 2019-025016

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4842* (2013.01); *H01L 21/561* (2013.01);
(Continued)

(58) Field of Classification Search
CPC ........... H01L 23/49548; H01L 21/4842; H01L 21/561; H01L 23/49582; H01L 23/3121;
(Continued)

(56) References Cited

U.S. PATENT DOCUMENTS 9,391,007 B1 *   7/2016  Yeung ..................... H01L 24/97
10,242,934 B1 *  3/2019  Sirinorakul ....... H01L 23/49582
(Continued)

FOREIGN PATENT DOCUMENTS

CN          1591853 A        3/2005
CN        103077935 A   *    5/2013  ....... H01L 23/49582
(Continued)

OTHER PUBLICATIONS

International Search Report issued in PCT/JP2020/004860, Apr. 21, 2020 (2 pages).
(Continued)

*Primary Examiner* — Ratisha Mehta
*Assistant Examiner* — Brad A Knudson
(74) *Attorney, Agent, or Firm* — HSML P.C.

(57) ABSTRACT

A semiconductor device includes a first lead, a semiconductor element, a sealing resin, a first plating layer, and a second plating layer. The first lead has a first obverse surface and a first reverse surface facing opposite from each other in a thickness direction and a first recess recessed from the first reverse surface toward the first obverse surface. The semiconductor element is mounted on the first obverse surface. The sealing resin covers the semiconductor element. The first plating layer is formed in contact with the first obverse surface and the first reverse surface. The first recess is exposed from the sealing resin. The first plating layer includes a first portion covering the first reverse surface. The second plating layer is formed in contact with the first recess and the first portion.

17 Claims, 25 Drawing Sheets

(51) Int. Cl.
  *H01L 21/56* (2006.01)
  *H01L 23/00* (2006.01)
  *H01L 23/31* (2006.01)
  *H01L 23/492* (2006.01)

(52) U.S. Cl.
  CPC .... H01L 23/4951 (2013.01); H01L 23/49541 (2013.01); H01L 23/49548 (2013.01); H01L 23/49562 (2013.01); H01L 23/49582 (2013.01); *H01L 23/3107* (2013.01); *H01L 23/3114* (2013.01); *H01L 23/3121* (2013.01); *H01L 23/492* (2013.01); *H01L 23/49579* (2013.01); *H01L 24/48* (2013.01); *H01L 2224/48175* (2013.01)

(58) Field of Classification Search
  CPC ........... H01L 24/48; H01L 2224/48175; H01L 21/541; H01L 23/495; H01L 23/49562; H01L 23/49575; H01L 23/49579; H01L 23/4951; H01L 23/49541; H01L 23/492; H01L 23/3107; H01L 23/3114
  See application file for complete search history.

(56) References Cited

U.S. PATENT DOCUMENTS

2005/0017335 A1* 1/2005 Tabira ............... H01L 23/49548
                                                              257/E23.054
2011/0165729 A1* 7/2011 Liu ..................... H01L 23/3107
                                                              257/E21.705
2017/0213782 A1* 7/2017 Iwai ..................... H01L 23/4952
2017/0316997 A1* 11/2017 Saito ....................... H01L 24/05
2019/0088574 A1* 3/2019 Kim .................. H01L 23/49562

FOREIGN PATENT DOCUMENTS

| JP | 2001077268 A | * | 3/2001 | ... H01L 2224/48247 |
|---|---|---|---|---|
| JP | 2005-38927 A | | 2/2005 | |
| JP | 2008-112961 A | | 5/2008 | |
| JP | 2012-109529 A | | 6/2012 | |
| JP | 2014-7287 A | | 1/2014 | |
| JP | 2017-201675 A | | 11/2017 | |
| JP | 2018-190882 A | | 11/2018 | |

OTHER PUBLICATIONS

Chinese Office Action received in the corresponding Chinese Patent application, Sep. 15, 2023, and machine translation (12 pages).
Office Action received in the corresponding Chinese Patent application, Jun. 7, 2023, and machine translation (13 pages).
Chinese Decision of final rejection received in the corresponding Chinese Patent application, Jan. 9, 2024, and machine translation (13 pages).

* cited by examiner

SEMICONDUCTOR DEVICE AND METHOD FOR MANUFACTURING SEMICONDUCTOR DEVICE

TECHNICAL FIELD

The present disclosure relates to a semiconductor device and a method for manufacturing a semiconductor device.

BACKGROUND ART

Semiconductor devices including semiconductor elements (such as transistors) have been proposed in a variety of structures. In one example, such a semiconductor device includes a semiconductor element that is covered with a sealing resin. Such a semiconductor device is manufactured by mounting a semiconductor element on a lead frame, covering the semiconductor element (and a portion of the lead frame) with a sealing resin, and cutting the lead frame and the sealing resin along predetermined cutting lines.

A semiconductor device configured as described above is mounted on a circuit board via, for example, a bonding material. Preferably, the bonding material is arranged to be externally visible, so that whether the semiconductor device is appropriately bonded to the circuit board can be confirmed visually. For that purpose, Patent Document 1 discloses a semiconductor device having inclined surfaces along the edges of the reverse surface (the surface to face the circuit board). Specifically, the document discloses the following. After a semiconductor element is mounted on a lead frame and a sealing resin is formed, a half-cutting step of cutting the lead frame halfway from the reverse surface is performed to form inclined cut faces. Subsequently, a plating layer is formed on the lead frame to coat the reverse surface and the inclined cut faces, followed by a full-cutting step of cutting the lead frame throughout.

The manufacturing process of a semiconductor device disclosed in Patent Document 1 additionally includes a wire bonding step of connecting electrodes of the semiconductor element and the lead frame by wires. Before the wire bonding step, a Ag plating layer is formed on the lead frame to improve the adhesion to bonding wires. The Ag plating layer is formed only on the selected regions to which bonding wires are to be bonded. This is to avoid lowering of the adhesion between the lead frame and the sealing by the presence of a Ag plating layer. Before the half-cutting step, a plating layer, such as a Sn plating layer, is formed on the reverse surface of the lead frame to reduce formation of burrs during cutting. After the half-cutting step, another Sn plating layer is formed as mentioned above to cover the freshly cut and hence exposed surfaces resulting from the half-cutting. That is, the conventional manufacturing method requires at least three plating steps.

PRIOR ART DOCUMENT

Patent Document

Patent Document 1: JP-A-2005-38927

SUMMARY OF THE INVENTION

Problem to be Solved by the Invention

In view of circumstances described above, the present disclosure aims to provide a semiconductor device engineered to allow the manufacturing steps to be simplified.

Means to Solve the Problem

A semiconductor device provided according to the present disclosure includes: a first lead having a first obverse surface and a first reverse surface facing opposite from each other in a thickness direction and a first recess that is recessed from the first reverse surface toward the first obverse surface; a semiconductor element mounted on the first obverse surface; a sealing resin covering the semiconductor element; a first plating layer formed in contact with the first obverse surface and the first reverse surface; and a second plating layer. The first recess is exposed from the sealing resin. The first plating layer includes a first portion covering the first reverse surface. The second plating layer is formed in contact with the first recess and the first portion. The semiconductor device having this configuration can be manufactured by the process involving two plating steps, one for forming the first plating layer, and the other for forming the second plating layer. This allows the manufacturing process to be simplified.

Other features and advantages of the present disclosure will be more apparent from the detailed description given below with reference to the accompanying drawings.

MODE FOR CARRYING OUT THE INVENTION

Preferred embodiments of the present disclosure will be specifically described below with reference to the accompanying drawings.

With reference to FIGS. 1 to 7, a semiconductor device A1 according to a first embodiment of the present disclosure will be described. The semiconductor device A1 shown in the figures include a plurality of leads 1 to 3, a semiconductor element 6, bonding wires 71 and 72, and a sealing resin 8.

Figure 1:
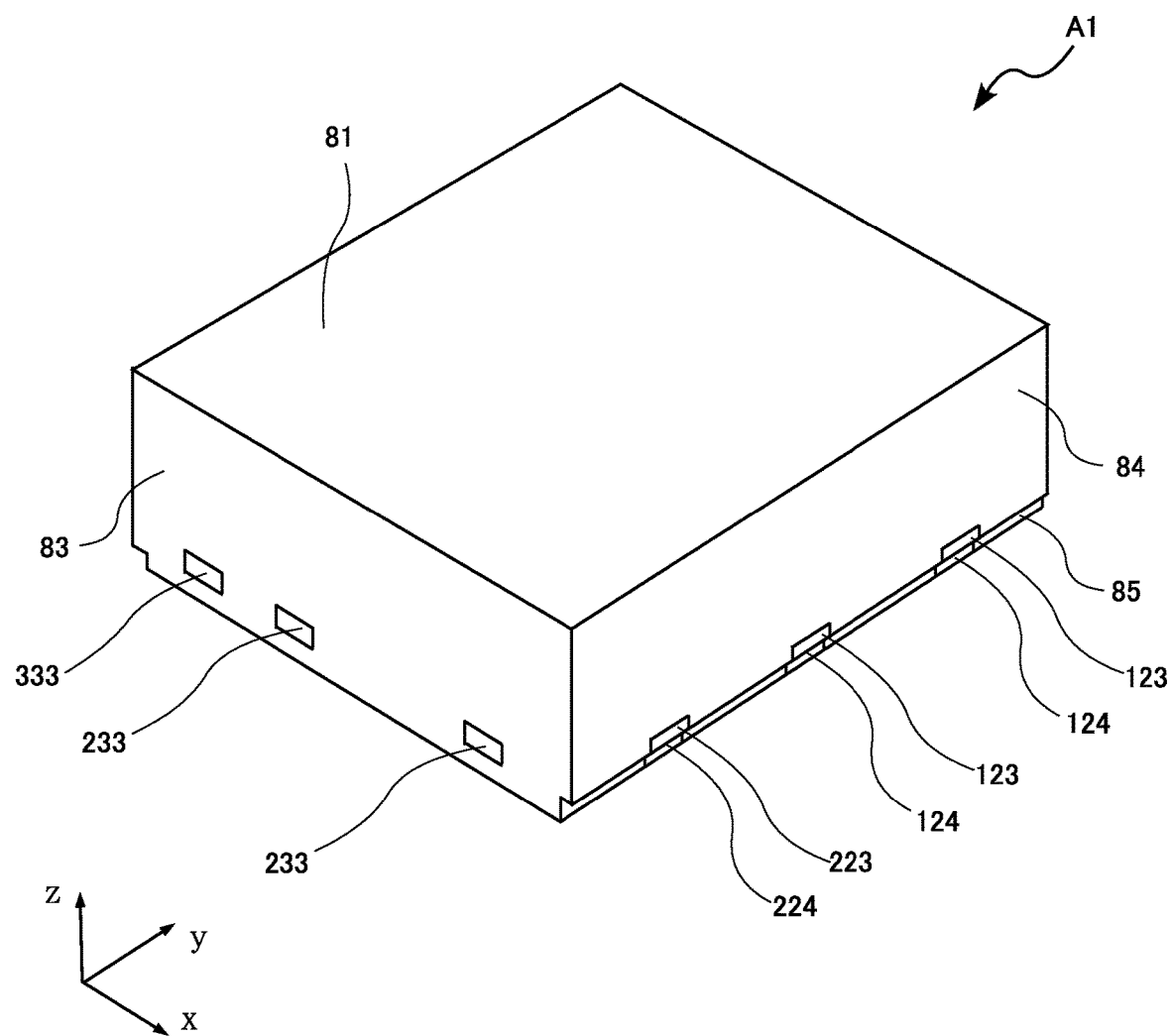
FIG. 1 is a perspective view of a semiconductor device according to a first embodiment.
Figure 2:
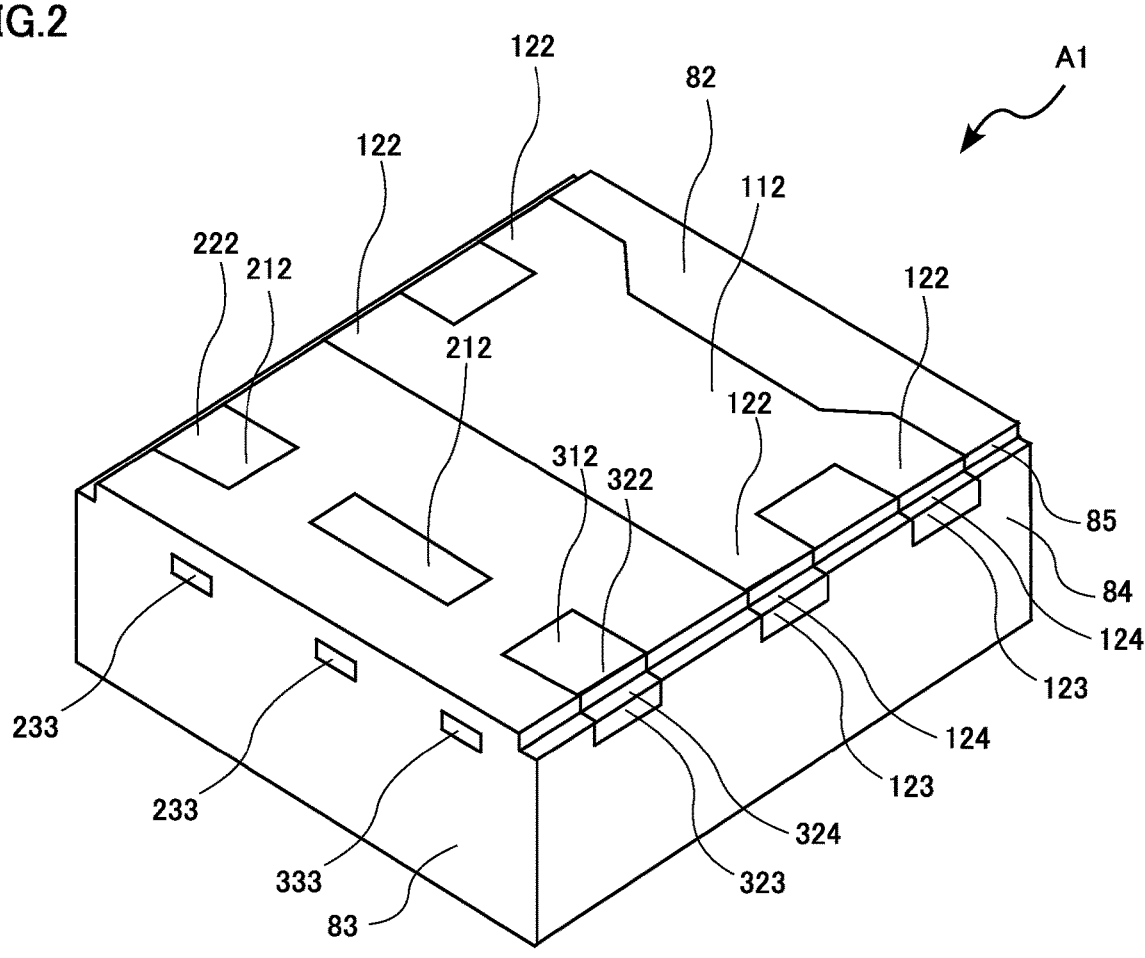
FIG. 2 is a perspective view of the semiconductor device shown in FIG. 1, placed with the bottom side up.
Figure 3:
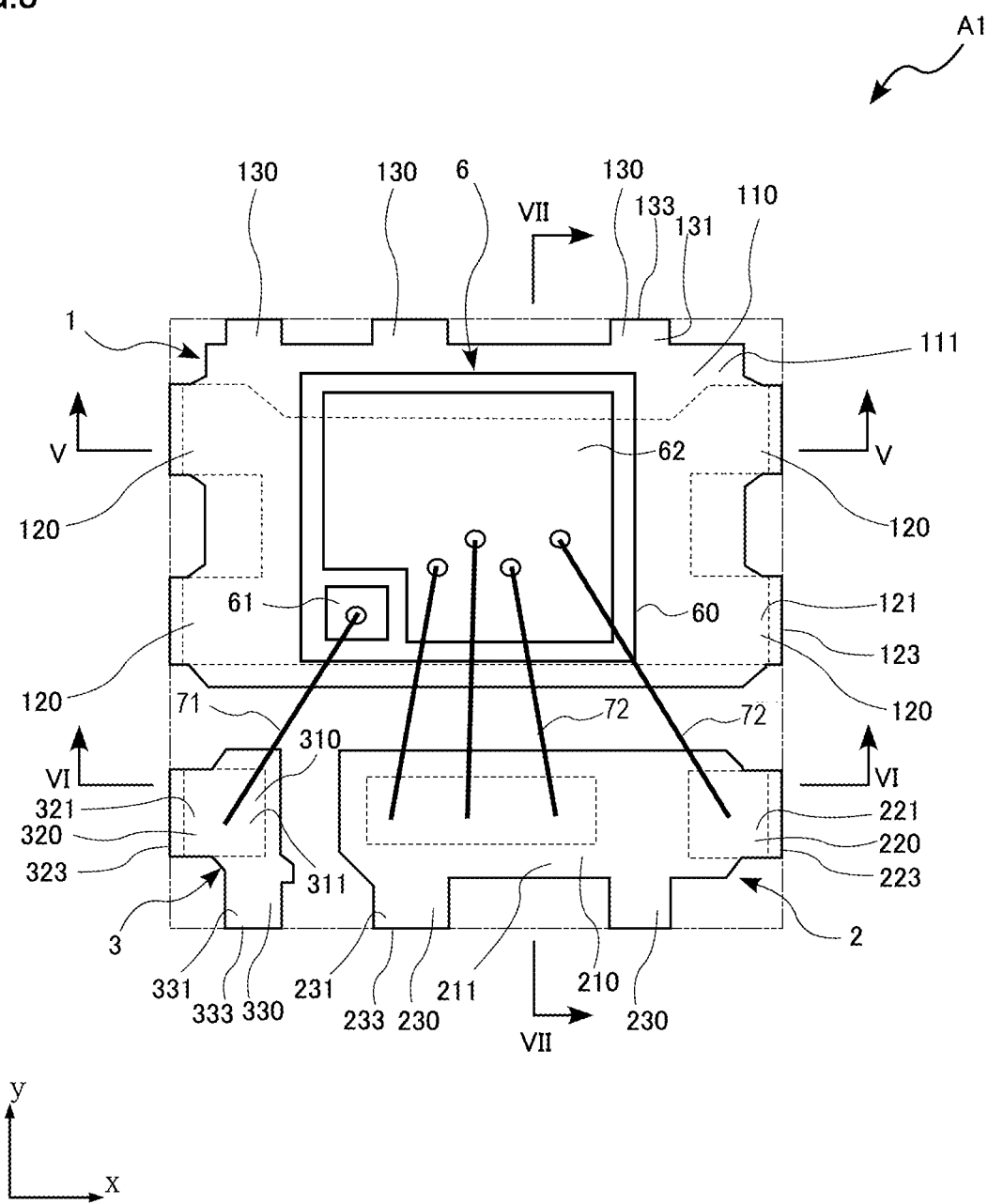
FIG. 3 is a plan view of the semiconductor device shown FIG. 1.
Figure 4:
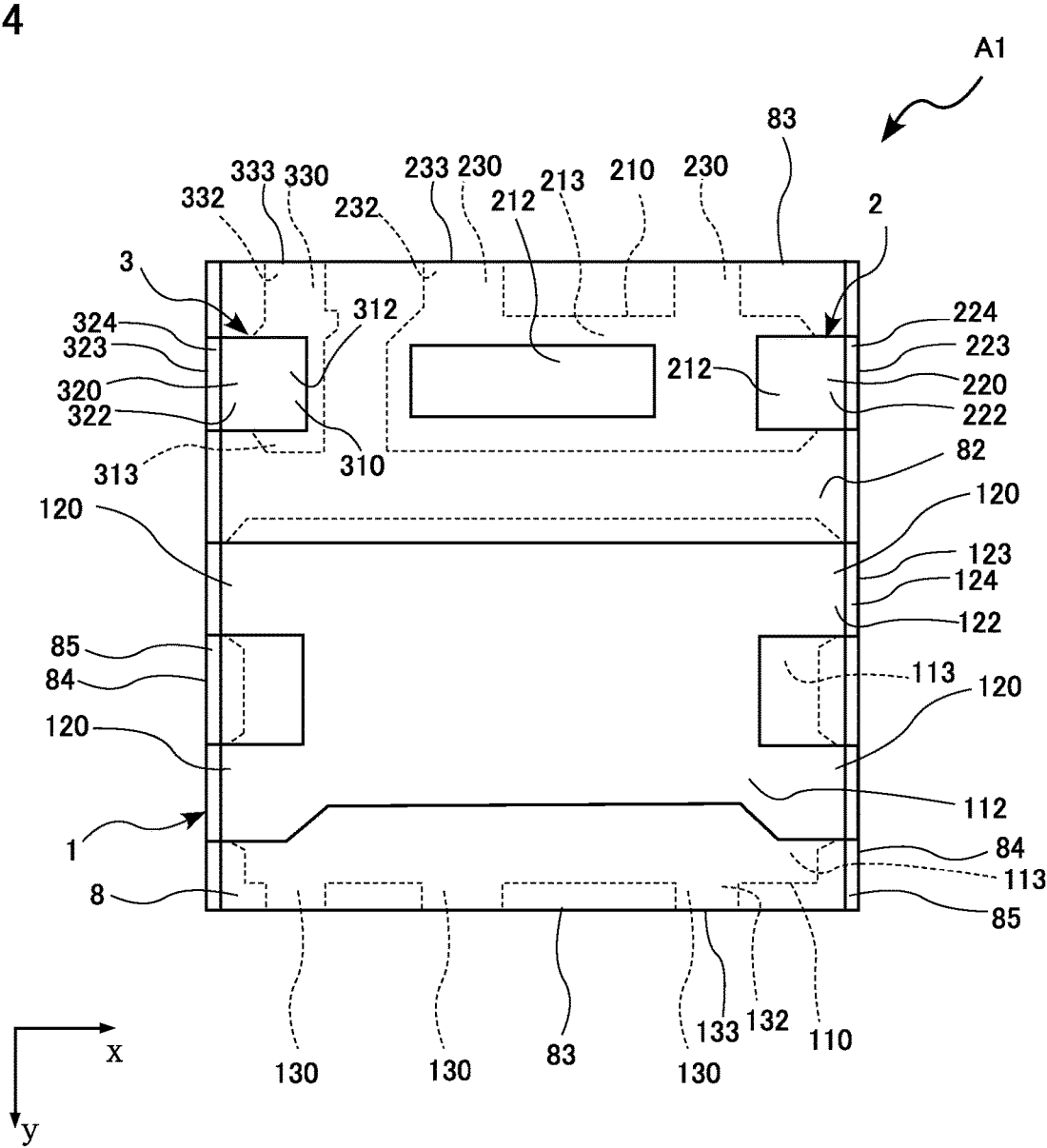
FIG. 4 is a bottom view of the semiconductor device shown FIG. 1.
Figure 5:
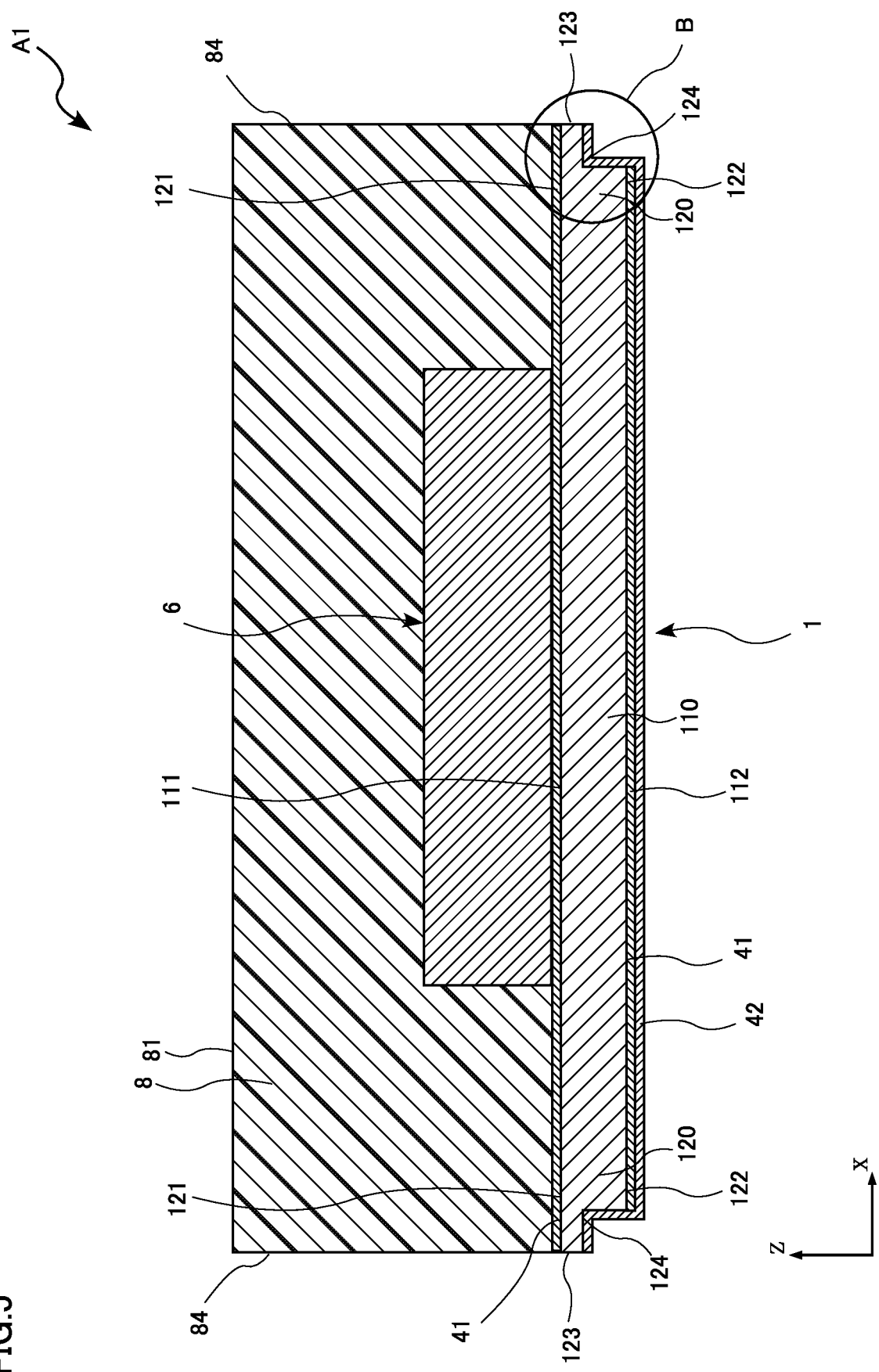
FIG. 5 is a sectional view taken along line V-V of FIG. 3.
Figure 6:
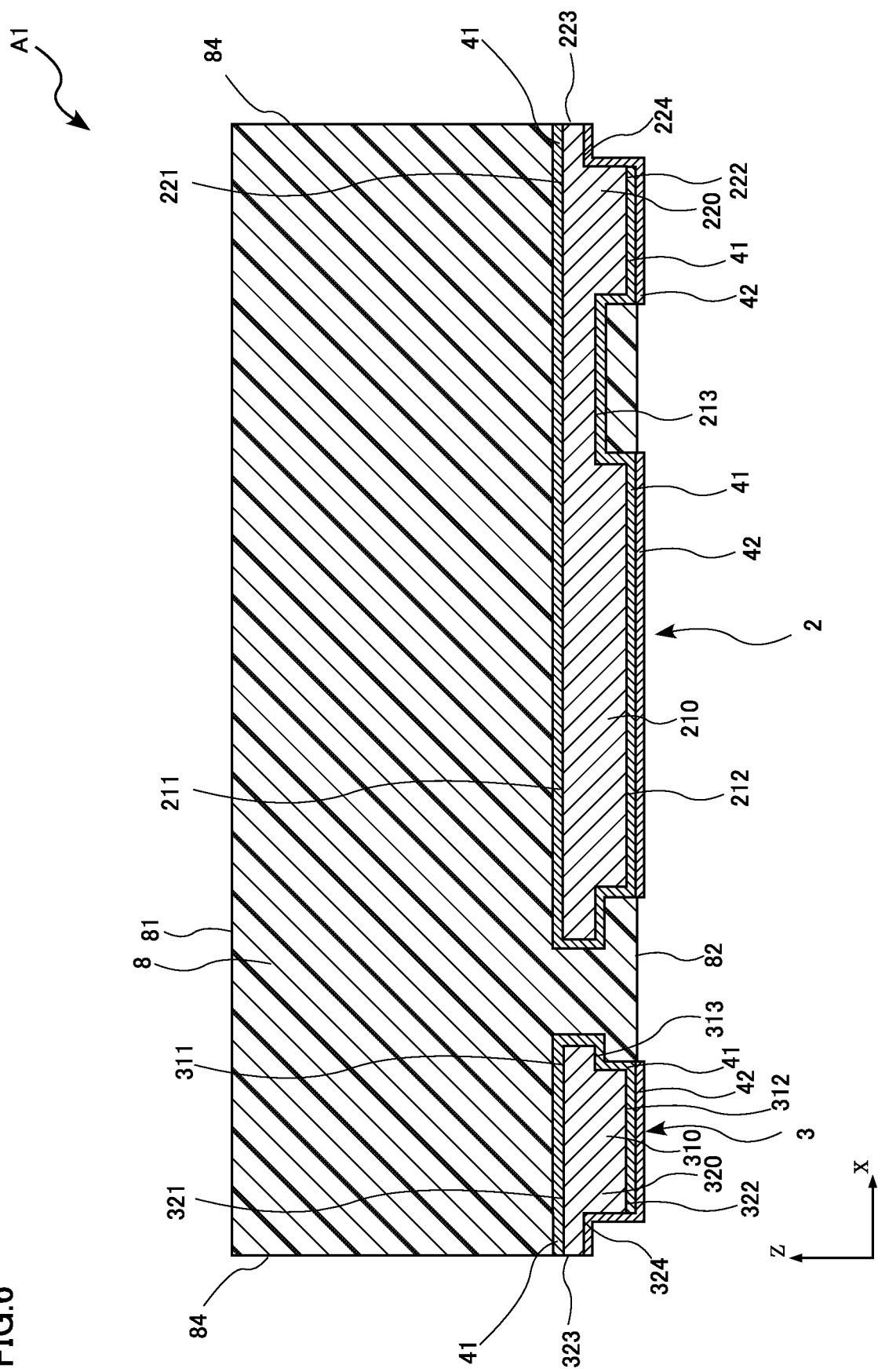
FIG. 6 is a sectional view taken along line VI-VI of FIG. 3.
Figure 7:
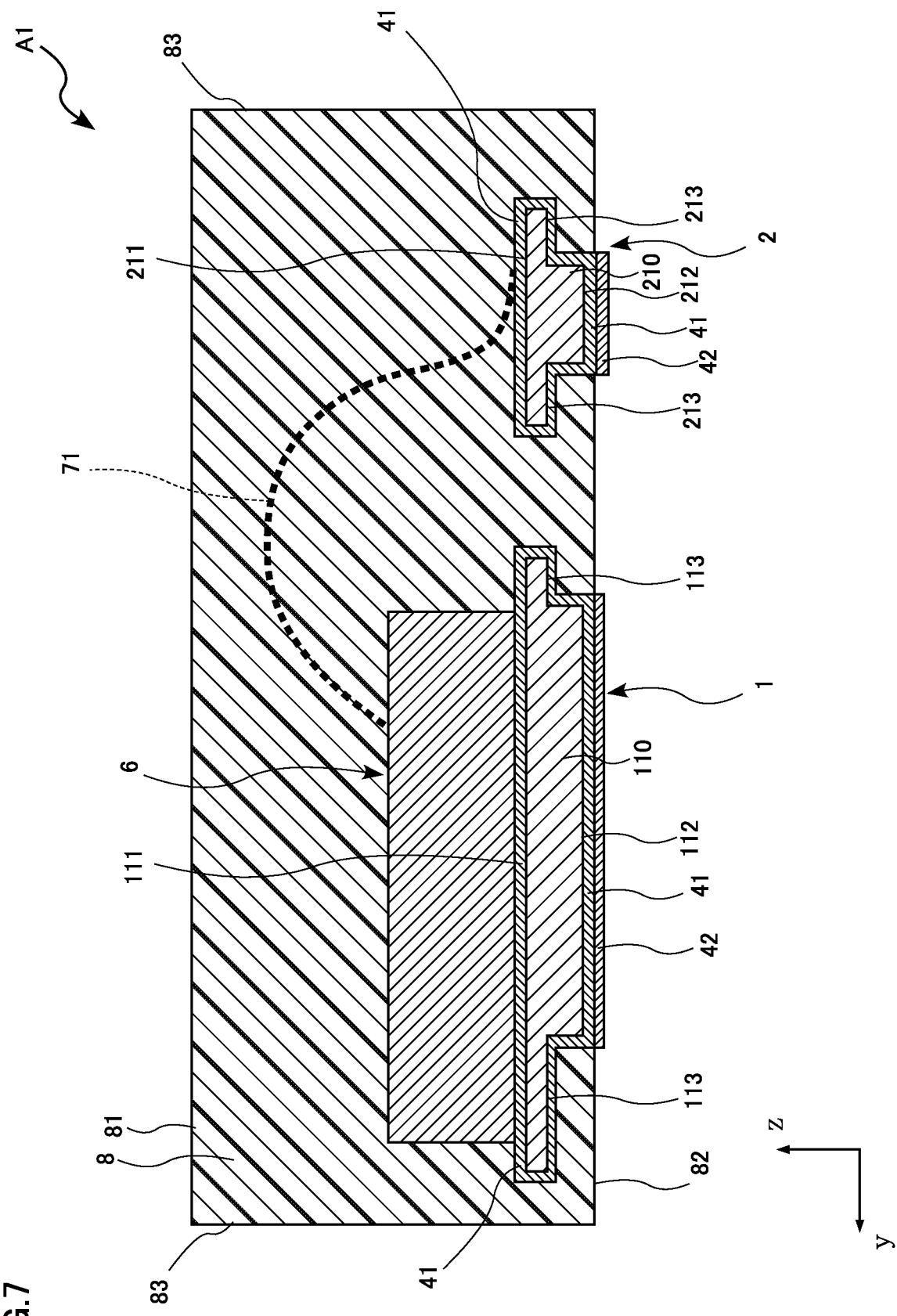
FIG. 7 is a sectional view taken along line VII-VII of FIG. 3.
Figure 8:
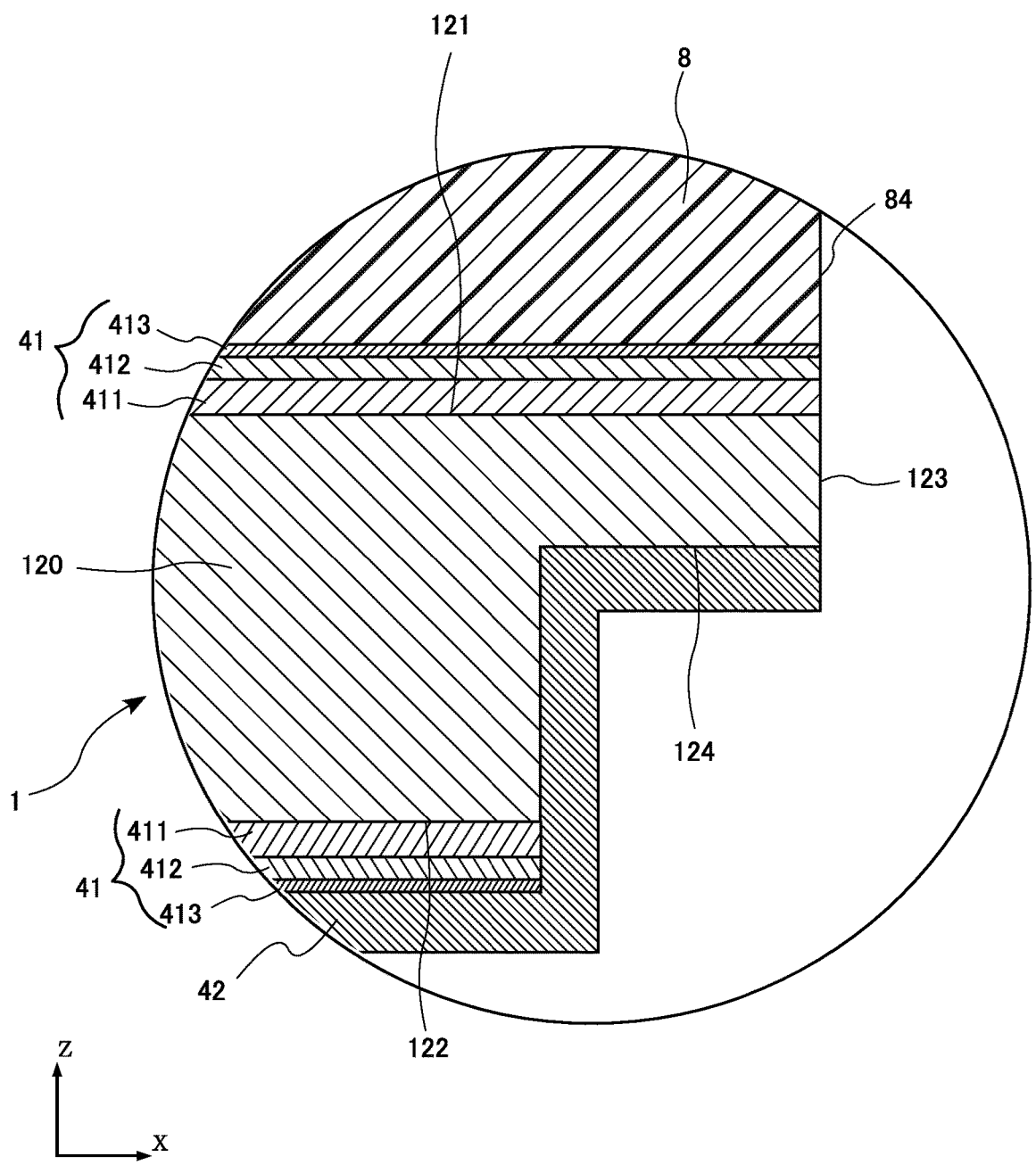
FIG. 8 is an enlarged fragmentary view of the semiconductor device shown FIG. 1.

FIG. 1 is a perspective view showing the semiconductor device A1. FIG. 2 is a perspective view showing the semiconductor device A1, placed with the bottom side up. FIG. 3 is a plan view showing the semiconductor device A1. For convenience, FIG. 3 is shown through a sealing resin 8, and the outline of the sealing resin 8 is represented by imaginary lines (dash-double dot lines). FIG. 4 is a bottom view showing the semiconductor device A1. FIG. 5 is a sectional view taken along line V-V of FIG. 3. FIG. 6 is a sectional view taken along line VI-VI of FIG. 3. FIG. 7 is a sectional view taken along line VII-VII of FIG. 3. FIG. 8 is an enlarged view showing a region enclosed within circle B of FIG. 5.

The semiconductor device A1 is designed for surface mounting on a circuit board of a variety of devices. The semiconductor device A1 is rectangular as viewed in the thickness direction. For convenience, the thickness direction of the semiconductor device A1 is defined as z direction. A direction perpendicular to the z direction along an edge of the semiconductor device A1 (the horizontal direction in FIG. 3) is defined as x direction. The direction perpendicular to the z direction and the x direction (the vertical direction in FIG. 3) is defined as y direction. The semiconductor device A1 is not limited to any specific size. In the illustrated example, the semiconductor device A1 measures, for example, 1 to 3 mm in the x direction, 1 to 3 mm in the y direction, and 0.3 to 1 mm in the z direction.

As shown in the figures, the lead 1 (first lead) supports the semiconductor element 6, and the leads 2 and 3 (second and third leads) are electrically connected to the semiconductor element 6 via bonding wires (described later). For example, the leads 1 to 3 are formed by processing a metal plate, such as punching or etching. The leads 1 to 3 are made of a metal, which is preferably either Cu or Ni, an alloy of such a metal, or 42Alloy. In the illustrated example, the leads 1 to 3 are made of Cu. The leads 1 to 3 have a thickness of 0.08 to 0.3 mm, for example. In the example shown in the figure, the leads 1 to 3 have a thickness of about 0.2 mm.

As shown in FIG. 3, the first lead 1 is disposed along one edge of the semiconductor device A1 in the y direction (upper edge in FIG. 3) and extends throughout the length of the semiconductor device A1 in the x direction. The second lead 2 and the third lead 3 are disposed next to each other along the other edge of the semiconductor device A1 in the y direction (lower edge in FIG. 3) and spaced apart from the first lead 1 in the x direction. As viewed in the z direction, the first lead 1 is largest in size (area), and the third lead 3 is smallest.

In the illustrated example, the first lead 1 includes a mount portion 110, a plurality of terminal portions 120 and a plurality of connecting portions 130.

The mount portion 110 is generally rectangular as viewed in the z direction. The mount portion 110 has a mount-portion obverse surface 111, a mount-portion reverse surface 112 and mount-portion recesses 113. The mount-portion obverse surface 111 and the mount-portion reverse surface 112 face opposite from each other in the z direction. The mount-portion obverse surface 111 faces upward in FIGS. 5 to 7. The mount-portion obverse surface 111 is a surface for mounting the semiconductor element 6. The mount-portion reverse surface 112 faces downward in FIGS. 5 to 7. The mount-portion reverse surface 112 is exposed from the sealing resin 8 and serves as a reverse-surface electrode. The mount-portion recesses 113 are portions of the mount portion 110 recessed from the mount-portion reverse surface 112 toward the mount-portion obverse surface 111. The thickness of the mount portion 110 (the z-direction dimension) measured at the mount-portion recesses 113 is about half the thickness measured at the mount-portion reverse surface 112. The mount-portion recesses 113 are formed by half-etching, for example. As shown in FIG. 7, the mount-portion recesses 113 are covered by the sealing resin 8 and not exposed from the sealing resin 8. This configuration reduces the risk of detachment of the first lead 1 from the sealing resin 8. The mount portion 110 is not limited to the shape as shown in the figures. The mount portion 110 may be without the mount-portion recesses 113.

The terminal portions 120 are rectangular as viewed in the z direction and connected to the mount portion 110. In this example, two terminal portions 120 are provided on each end of the mount portion 110 in the x direction, which means four terminal portions 120 are provided in total. Each terminal portion 120 has a terminal-portion obverse surface 121, a terminal-portion reverse surface 122, a terminal-portion end surface 123 and a terminal-portion recess 124. The terminal-portion obverse surface 121 and the terminal-portion reverse surface 122 face opposite from each other in the z direction. The terminal-portion obverse surface 121 faces upward in FIGS. 5 to 7. The terminal-portion obverse surface 121 is flush with the mount-portion obverse surface 111. The terminal-portion reverse surface 122 faces downward in FIGS. 5 to 7. The terminal-portion reverse surface 122 is flush with the mount-portion reverse surface 112. The terminal-portion end surface 123 is perpendicular to the terminal-portion obverse surface 121 and the terminal-portion reverse surface 122, is connected to the terminal-portion obverse surface 121, and faces outward in the x direction. In the manufacturing process, the terminal-portion end surfaces 123 are formed by full-cut dicing in a first cutting step, which will be described later. Each terminal-portion recess 124 is recessed from the terminal-portion reverse surface 122 toward the terminal-portion obverse surface 121. In the y direction, the terminal-portion recess 124 extends from one end to the other end of the terminal-portion reverse surface 122 along an edge outward in the x direction. The terminal-portion recess 124 is connected to the terminal-portion reverse surface 122 and the terminal-portion end surface 123. In the manufacturing process, the terminal-portion recesses 124 are formed by half-cut dicing in a trench forming step, which will be described later. The terminal-portion end surfaces 123, the terminal-portion reverse surface 122 and the terminal-portion recesses 124 are exposed from the sealing resin 8 and integrally serve as terminals (see FIGS. 4 and 5). The shape, location and number of the terminal portions 120 to be provided are not specifically limited.

The connecting portions 130 are rectangular as viewed in the z direction and connected to the mount portion 110. In this example, three connecting portions 130 are provided next to each other in the x direction at an end of the mount portion 110 in the y direction (the upper end in FIG. 3). The connecting portions 130 have a thickness (z-direction dimension) that is substantially the same as the thickness of the mount portion 110 measured at the mount-portion recesses 113. The connecting portions 130 are formed by half-etching, for example. Each connecting portion 130 has a connecting-portion obverse surface 131, a connecting-portion reverse surface 132 and a connecting-portion end surface 133. The connecting-portion obverse surface 131 and the connecting-portion reverse surface 132 face opposite from each other in the z direction. The connecting-portion obverse surface 131 faces upward in FIGS. 5 to 7. The connecting-portion obverse surface 131 is flush with the mount-portion obverse surface 111. That is, the mount-portion obverse surface 111, the terminal-portion obverse surfaces 121 and the connecting-portion obverse surfaces 131 are regions of one continuous surface (see FIG. 3). The connecting-portion reverse surface 132 faces downward in FIGS. 5 to 7. The connecting-portion reverse surface 132 is flush with the mount-portion recesses 113. The connecting-portion end surface 133 connects the connecting-portion obverse surface 131 and the connecting-portion reverse surface 132 and faces outward in the y direction. In the manufacturing process, the connecting-portion end surfaces 133 are formed by full-cut dicing in the second cutting step, which will be described later. The connecting-portion end surfaces 133 are exposed from the sealing resin 8. The shape, location and number of the connecting portions 130 to be provided are not specifically limited.

As shown in FIGS. 5, 7 and 8, most of the surface of the first lead 1 is covered by the first plating layer 41. Specifically, the mount-portion obverse surface 111, the terminal-portion obverse surfaces 121 and the connecting-portion obverse surfaces 131 of the first plating layer 41 are covered by the first plating layer 41. Also, the mount-portion reverse surface 112, the mount-portion recesses 113, the terminal-portion reverse surfaces 122 and the connecting-portion reverse surfaces 132 of the first lead 1 are covered by the first plating layer 41. As show in FIG. 8, each first plating layer 41 is a stack of a Ni plating layer (inner layer) 411, a Pd plating layer (interlayer) 412 and a Au plating layer (outer layer) 413.

The Ni plating layer 411 is formed in contact with the first lead 1. The Ni plating layer 411 is made of Ni or a Ni alloy. The Ni plating layer 411 may have a coarse Ni layer on its surface (the surface opposite from the first lead 1). The Ni plating layer 411 may have a thickness of 0.5 to 2.0 µm, for example. The Pd plating layer 412 is formed in contact with the Ni plating layer 411 and overlaps with the Ni plating layer 411. The Pd plating layer 412 may have a thickness of 0.01 to 0.15 µm, for example. The Au plating layer 413 is formed is formed in contact with the Pd plating layer 412 and overlaps with the Pd plating layer 412. The Au plating layer 413 may have a thickness of 0.003 to 0.015 µm, for example. Note, however, that the first plating layer 41 is not limited to the specific configuration described above.

As will be described later, in the manufacturing process, the first plating layer 41 is formed on a lead frame so as to coat the entire surface of the lead frame. However, the terminal-portion end surfaces 123 and the connecting-portion end surfaces 133 are cut surfaces formed in the first or second cutting step and hence not coated with the first plating layer 41.

As shown in FIGS. 5 and 7, the first plating layer 41 has a portion (first portion) formed on the mount-portion reverse surface 112 and the terminal-portion reverse surfaces 122. The first portion of the first plating layer 41 and the terminal-portion recesses 124 are coated with a second plating layer 42. The second plating layer 42 is made of a material having higher solder wettability than Cu, which is the base material of the first lead 1. The second plating layer 42 is made of a Sn-based alloy. Specifically, the alloy is a lead-free solder, such as a Sn—Sb alloy or an Sn—Ag alloy. Note, however, that the second plating layer 42 is not limited to the specific composition described above.

The terminal-portion end surfaces 123 are not coated with the first plating layer 41 and the second plating layer 42. However, the terminal-portion recesses 124 are coated with the second plating layer 42. Consequently, when the semiconductor device A1 is mounted on a circuit board, the second plating layer 42 will form solder fillets along the terminal-portion recesses 124. This serves to increase the bonding strength of the semiconductor device A1 to the circuit board. In addition, the bonding state of the first lead 1 to the circuit board can be easily determined by visual inspection.

The second lead 2 is disposed at a corner (the bottom right corner in FIG. 3) of the semiconductor device A1 as viewed in the z direction and includes a wire bonding portion 210, a terminal portion 220 and connecting portions 230.

As viewed in the z direction, the wire bonding portion 210 has a rectangular shape elongated in the x direction. The wire bonding portion 210 is located closer in the second lead 2 to the first lead 1. The wire bonding portion 210 has a wire-bonding-portion obverse surface 211, a wire-bonding-portion reverse surface 212 and a wire-bonding-portion recess 213. The wire-bonding-portion obverse surface 211 and the wire-bonding-portion reverse surface 212 face opposite from each other in the z direction. The wire-bonding-portion obverse surface 211 faces upward in FIGS. 5 to 7. The wire-bonding-portion obverse surface 211 is where the bonding wires 71 are to be bonded. The wire-bonding-portion reverse surface 212 faces downward in FIGS. 5 to 7. The wire-bonding-portion reverse surface 212 exposed from the sealing resin 8 and serves as a reverse-surface electrode. The wire-bonding-portion recess 213 is a portion of the wire bonding portion 210 recessed from the wire-bonding-portion reverse surface 212 toward the wire-bonding-portion obverse surface 211. The thickness of the wire bonding portion 210 (the z-direction dimension) measured at the wire-bonding-portion recess 213 is about half the thickness measured at the wire-bonding-portion reverse surface 212. The wire-bonding-portion recess 213 is formed by half-etching, for example. As shown in FIGS. 6 and 7, the wire-bonding-portion recess 213 is covered by the sealing resin 8 and not exposed from the sealing resin 8. This reduces the risk of detachment of the second lead 2 from the sealing resin 8. The wire bonding portion 210 is not limited to a specific shape. In one example, the wire-bonding-portion recess 213 may be omitted.

The terminal portion 220 is rectangular as viewed in the z direction and connected to the wire bonding portion 210. The terminal portion 220 is located at an end of the wire bonding portion 210 opposite from the third lead 3 in the x direction (at the right end in FIG. 3). The terminal portion 220 has a terminal-portion obverse surface 221, a terminal-portion reverse surface 222, a terminal-portion end surface 223 and a terminal-portion recess 224. The terminal-portion obverse surface 221 and the terminal-portion reverse surface 222 face opposite from each other in the z direction. The terminal-portion obverse surface 221 faces upward in FIGS. 5 to 7. The terminal-portion obverse surface 221 is flush with the wire-bonding-portion obverse surface 211. The terminal-portion reverse surface 222 faces downward in FIGS. 5 to 7. The terminal-portion reverse surface 222 is flush with the wire-bonding-portion reverse surface 212. The terminal-portion end surface 223 is perpendicular to the terminal-portion obverse surface 221 and the terminal-portion reverse surface 222, is connected to the terminal-portion obverse surface 221, and faces outward in the x direction. In manufacturing process, the terminal-portion end surface 223 is formed by full-cut dicing in the first cutting step, which will be described later. The terminal-portion recess 224 is recessed from the terminal-portion reverse surface 222 toward the terminal-portion obverse surface 221. In the y direction, the terminal-portion recess 224 extends from one end to the other end of the terminal-portion reverse surface 222 along an edge outward in the x direction. The terminal-portion recess 224 is connected to the terminal-portion reverse surface 222 and the terminal-portion end surface 223. In the manufacturing process, the terminal-portion recess 224 is formed by half-cut dicing in the trench forming step, which will be described later. The terminal-portion end surface 223, the terminal-portion reverse surface 222 and the terminal-portion recess 224 are exposed from the sealing resin 8 and integrally serve as a terminal (see FIGS. 4 and 6). The shape, location and number of the terminal portions 220 to be provided are not specifically limited.

The connecting portions 230 are rectangular as viewed in the z direction and connected to the wire bonding portion 210. In this example, two connecting portions 230 are provided next to each other in the x direction at an end of the wire bonding portion 210 in the y direction (the lower end in FIG. 3). The connecting portions 230 have a thickness (z-direction dimension) that is substantially the same as the thickness of the wire bonding portion 210 measured at the wire-bonding-portion recess 213. The connecting portions 230 are formed by half-etching, for example. Each connecting portion 230 has a connecting-portion obverse surface 231, a connecting-portion reverse surface 232 and a connecting-portion end surface 233. The connecting-portion obverse surface 231 and the connecting-portion reverse surface 232 face opposite from each other in the z direction. The connecting-portion obverse surface 231 faces upward in FIGS. 5 to 7. The connecting-portion obverse surface 231 is flush with the wire-bonding-portion obverse surface 211. That is, the wire-bonding-portion obverse surface 211, the terminal-portion obverse surface 221 and the connecting-portion obverse surfaces 231 are regions of one continuous surface (see FIG. 3). The connecting-portion reverse surface 232 faces downward in FIGS. 5 to 7. The connecting-portion reverse surface 232 is flush with the wire-bonding-portion recess 213. The connecting-portion end surface 233 connects the connecting-portion obverse surface 231 and the connecting-portion reverse surface 232 and faces outward in the y direction. In the manufacturing process, the connecting-portion end surfaces 233 are formed by full-cut dicing in the second cutting step, which will be described later. The connecting-portion end surfaces 233 are exposed from the sealing resin 8. The shape, location and number of the connecting portions 230 to be provided are not specifically limited.

As shown in FIGS. 6 and 7, a first plating layer 41 is formed on the second lead 2 to coat the wire-bonding-portion obverse surface 211, the terminal-portion obverse surface 221, the connecting-portion obverse surfaces 231, the wire-bonding-portion reverse surface 212, the wire-bonding-portion recess 213, the terminal-portion reverse surface 222, and the connecting-portion reverse surfaces 232. This first plating layer 41 is the same as the first plating layer 41 formed on the first lead 1. As will be described later, in the manufacturing process, the first plating layer 41 is formed on a lead frame so as to coat the entire surface of the lead frame. However, the terminal-portion end surface 223 and the connecting-portion end surfaces 233 are cut surfaces formed in the first or second cutting step and hence not coated with the first plating layer 41.

As shown in FIGS. 6 and 7, the first plating layer 41 has portions (second portions) formed on the wire-bonding-portion reverse surface 212 and the terminal-portion reverse surface 222. The second portions of the first plating layer 41 and the terminal-portion recess 224 are coated with a second plating layer 42. This second plating layer 42 is the same as the second plating layer 42 formed on the first lead 1.

The terminal-portion end surface 223 is not coated with the first plating layer 41 and the second plating layer 42 However, the terminal-portion recess 224 is coated with the second plating layer 42. Consequently, when the semiconductor device A1 is mounted on a circuit board, the second plating layer 42 will form a solder fillet along the terminal-portion recess 224. The solder fillet serves to increase the bonding strength of the semiconductor device A1 to the circuit board. In addition, by visually inspecting the solder fillet, the bonding state of the second lead 2 to the circuit board can be easily determined.

The third lead 3 is disposed at a corner (the bottom left corner in FIG. 3) of the semiconductor device A1 as viewed in the z direction and includes a wire bonding portion 310, a terminal portion 320 and a connecting portion 330.

As viewed in the z direction, the wire bonding portion 310 is rectangular and is located closer in the third lead 3 to the first lead 1. The wire bonding portion 310 has a wire-bonding-portion obverse surface 311, a wire-bonding-portion reverse surface 312 and a wire-bonding-portion recess 313. The wire-bonding-portion obverse surface 311 and the wire-bonding-portion reverse surface 312 face opposite from each other in the z direction. The wire-bonding-portion obverse surface 311 faces upward in FIGS. 5 to 7. The wire-bonding-portion obverse surface 311 is where the bonding wire 72 is to be bonded. The wire-bonding-portion reverse surface 312 faces downward in FIGS. 5 to 7. The wire-bonding-portion reverse surface 312 is exposed from the sealing resin 8 and serves as a reverse-surface electrode. The wire-bonding-portion recess 313 is a portion of the wire bonding portion 310 recessed from the wire-bonding-portion reverse surface 312 recessed toward the wire-bonding-portion obverse surface 311. The thickness of the wire bonding portion 310 (the z-direction dimension) measured at the wire-bonding-portion recess 313 is about half the thickness measured at the wire-bonding-portion reverse surface 312. The wire-bonding-portion recess 313 is formed by half-etching, for example. As shown in FIG. 6, the wire-bonding-portion recess 313 is covered by the sealing resin 8 and not exposed from the sealing resin 8. This reduces the risk of detachment of the third lead 3 from the sealing resin 8. The wire bonding portion 310 is not limited to a specific shape. In one example, the wire-bonding-portion recess 313 may be omitted.

The terminal portion 320 is rectangular as viewed in the z direction and connected to the wire bonding portion 310. The terminal portion 320 is located at an end of the wire bonding portion 310 opposite from the second lead 2 in the x direction (at the left end in FIG. 3). The terminal portion 320 has a terminal-portion obverse surface 321, a terminal-portion reverse surface 322, a terminal-portion end surface 323 and a terminal-portion recess 324. The terminal-portion obverse surface 321 and the terminal-portion reverse surface 322 face opposite from each other in the z direction. The terminal-portion obverse surface 321 faces upward in FIGS. 5 to 7. The terminal-portion obverse surface 321 is flush with the wire-bonding-portion obverse surface 311. The terminal-portion reverse surface 322 faces downward in FIGS. 5 to 7. The terminal-portion reverse surface 322 is flush with the wire-bonding-portion reverse surface 312. The terminal-portion end surface 323 is perpendicular to the terminal-portion obverse surface 321 and the terminal-portion reverse surface 322, is connected to the terminal-portion obverse surface 321, and faces outward in the x direction. In the manufacturing process, the terminal-portion end surface 323 is formed by full-cut dicing in the first cutting step, which will be described later. The terminal-portion recess 324 is recessed from the terminal-portion reverse surface 322 toward the terminal-portion obverse surface 321. In the y direction, the terminal-portion recess 324 extends from one end to the other end of the terminal-portion reverse surface 322 along an edge outward in the x direction. The terminal-portion recess 324 is connected to the terminal-portion reverse surface 322 and the terminal-portion end surface 323. In the manufacturing process, the terminal-portion recess 324 is formed by half-cut dicing in the trench forming step, which will be described later. The terminal-portion end surface 323, the terminal-portion reverse surface 322 and the terminal-portion recess 324 are exposed from the sealing resin 8 and integrally serve as a terminal (see FIGS. 4 and 6). The shape, location and number of the terminal portions 320 to be provided are not specifically limited.

The connecting portion 330 is rectangular as viewed in the z direction and connected to the wire bonding portion 310. The connecting portion 330 (the third lead 3 has only one connecting portion) is located at an end of the wire bonding portion 310 in the y direction (the lower end in FIG. 3). The connecting portion 330 has a thickness (z-direction dimension) that is substantially the same as the thickness of the wire bonding portion 310 measured at the wire-bonding-portion recess 313. The connecting portion 330 is formed by half-etching, for example. The connecting portion 330 has a connecting-portion obverse surface 331, a connecting-portion reverse surface 332 and a connecting-portion end surface 333. The connecting-portion obverse surface 331 and the connecting-portion reverse surface 332 face opposite from each other in the z direction. The connecting-portion obverse surface 331 faces upward in FIGS. 5 to 7. The connecting-portion obverse surface 331 is flush with the wire-bonding-portion obverse surface 311. That is, the wire-bonding-portion obverse surface 311, the terminal-portion obverse surface 321 and the connecting-portion obverse surfaces 331 are regions of one continuous surface (see FIG. 3). The connecting-portion reverse surface 332 faces downward in FIGS. 5 to 7. The connecting-portion reverse surface 332 is flush with the wire-bonding-portion recess 313. The connecting-portion end surface 333 connects the connecting-portion obverse surface 331 and the connecting-portion reverse surface 332 and faces outward in the y direction. In the manufacturing process, the connecting-portion end surface 333 is formed by full-cut dicing in the second cutting step, which will be described later. The connecting-portion end surface 333 is exposed from the sealing resin 8. The shape, location and number of the connecting portions 330 to be provided are not specifically limited.

As shown in FIG. 6, a first plating layer 41 is formed on the third lead 3 to coat the wire-bonding-portion obverse surface 311, the terminal-portion-obverse surface 321, the connecting-portion obverse surface 331, the wire-bonding-portion reverse surface 312, the wire-bonding-portion recess 313, the terminal-portion reverse surface 322 and the connecting-portion reverse surface 332. This first plating layer 41 is the same as the first plating layer 41 formed on the first lead 1. As will be described later, in the manufacturing process, the first plating layer 41 is formed on a lead frame so as to coat the entire surface of the lead frame. However, the terminal-portion end surface 323 and the connecting-portion end surface 333 are cut surfaces formed in the first or second cutting step and hence not coated with the first plating layers 41.

As shown in FIG. 6, a second plating layer 42 is formed on the first plating layer 41, which coats the wire-bonding-portion reverse surface 312 and the terminal-portion reverse surface 322, and the terminal-portion recess 324. This second plating layer 42 is the same as the second plating layer 42 formed on the first lead 1.

The terminal-portion end surface 323 is not coated with the first plating layer 41 and the second plating layer 42. However, the terminal-portion recess 324 is coated with the second plating layer 42. Consequently, when the semiconductor device A1 is mounted on a circuit board, the second plating layer 42 will form a solder fillet along the terminal-portion recess 324. The solder fillet serves to increase the bonding strength of the semiconductor device A1 to the circuit board. In addition, the bonding state of the third lead 3 to the circuit board can be easily determined by visual inspection.

The semiconductor element 6 performs electrical functions of the semiconductor device A1. The semiconductor element 6 is not limited to a specific type. For example, the semiconductor element 6 may be a transistor, such as a metal-oxide-semiconductor field-effect transistor (MOSFET). The semiconductor element 6 includes an element body 60, a first electrode 61, a second electrode 62 and a third electrode 63.

The first electrode 61 and the second electrode 62 are disposed on the surface of the element body 60 facing away from the first lead 1. The third electrode 63 is disposed on the surface of the element body 60 facing toward the first lead 1. In the example shown in the figure, the first electrode 61 is a gate electrode, the second electrode 62 is a source electrode, and the third electrode 63 is a drain electrode.

The semiconductor element 6 is placed at the central portion of the mount-portion obverse surface 111 of the first lead 1 coated with the first plating layer 41, and bonded by a non-illustrated electrically conductive bonding material. By this electrically conductive bonding material, the third electrode 63 of the semiconductor element 6 is electrically connected to the first lead 1. The bonding wire 71 is joined to the first electrode 61 of the semiconductor element 6 and to the wire-bonding-portion obverse surface 311 of the third lead 3, which is coated with the first plating layer 41. By this bonding wire, the first electrode 61 of the semiconductor element 6 is electrically connected to the third lead 3. The bonding wires 72 are joined to the second electrode 62 of the semiconductor element 6 and to the wire-bonding-portion obverse surface 211 of the second lead 2, which is coated with the first plating layer 41. By these bonding wires, the second electrode 62 of the semiconductor element 6 is electrically connected to the second lead 2.

The configuration of the semiconductor element 6 and the connections to the leads 1 to 3 are described only by way of exempla. The type and number of the semiconductor element 6 to be mounted are not specifically limited, and the mounting arrangement and connections are not limited either.

The sealing resin 8 covers the semiconductor element 6, the bonding wires 71 and 72 and portions of the leads 1 to 3. The sealing resin 8 is made of a black epoxy resin, for example.

The sealing resin 8 has a resin obverse surface 81, a resin reverse surface 82, a pair of resin first side surfaces 83, a pair of resin second side surfaces 84, and resin recesses 85. The resin obverse surface 81 and the resin reverse surface 82 face opposite from each other in the z direction. The resin obverse surface 81 faces upward in FIGS. 5 to 7, and the resin reverse surface 82 faces downward in FIGS. 5 to 7. The resin first side surfaces 83 connect the resin obverse surface 81 and the resin reverse surface 82 and face outward in the y direction. In the manufacturing process, the resin first side surfaces 83 are formed by full-cut dicing in the second cutting step, which will be described later. The resin second side surfaces 84 are perpendicular to the resin obverse surface 81 and the resin reverse surface 82, are connected to the resin obverse surface 81, and face outward in the x direction. In the manufacturing process, the resin second side surfaces 84 are formed by full-cut dicing in the first cutting step, which will be described later. The resin recesses 85 are portions recessed from the resin reverse surface 82 toward the resin obverse surface 81. In the y direction, the resin recesses 85 extend from one end to the other end of the resin reverse surface 82 along the opposite edges in the x direction. The resin recesses 85 connect the resin reverse surface 82 to the resin second side surface 84. In the manufacturing process, the resin recesses 85 are formed by half-cut dicing in the trench forming step, which will be described later.

One of the resin first side surfaces 83 (the lower one in FIG. 4) is flush with the connecting-portion end surfaces 133 of the first lead 1, whereas the other resin first side surface 83 (the upper one in FIG. 4) is flush with the connecting-portion end surfaces 233 of the second lead 2 and the connecting-portion end surface 333 of the third lead 3. One of the resin second side surfaces 84 (the right one in FIG. 4) is flush with the terminal-portion end surfaces 123 located at the corresponding end of the first lead 1 in the x direction (the right end in FIG. 4) and also with the terminal-portion end surface 223 of the second lead 2. The other resin second side surface 84 (the left one in FIG. 4) is flush with the terminal-portion end surfaces 123 located at the corresponding end of the first lead 1 in the x direction (the left end in FIG. 4) and also with the terminal-portion end surface 323 of the third lead 3.

Next, one example of a method for manufacturing a semiconductor device A1 will be described with reference to FIGS. 9 to 16.

Figure 9:
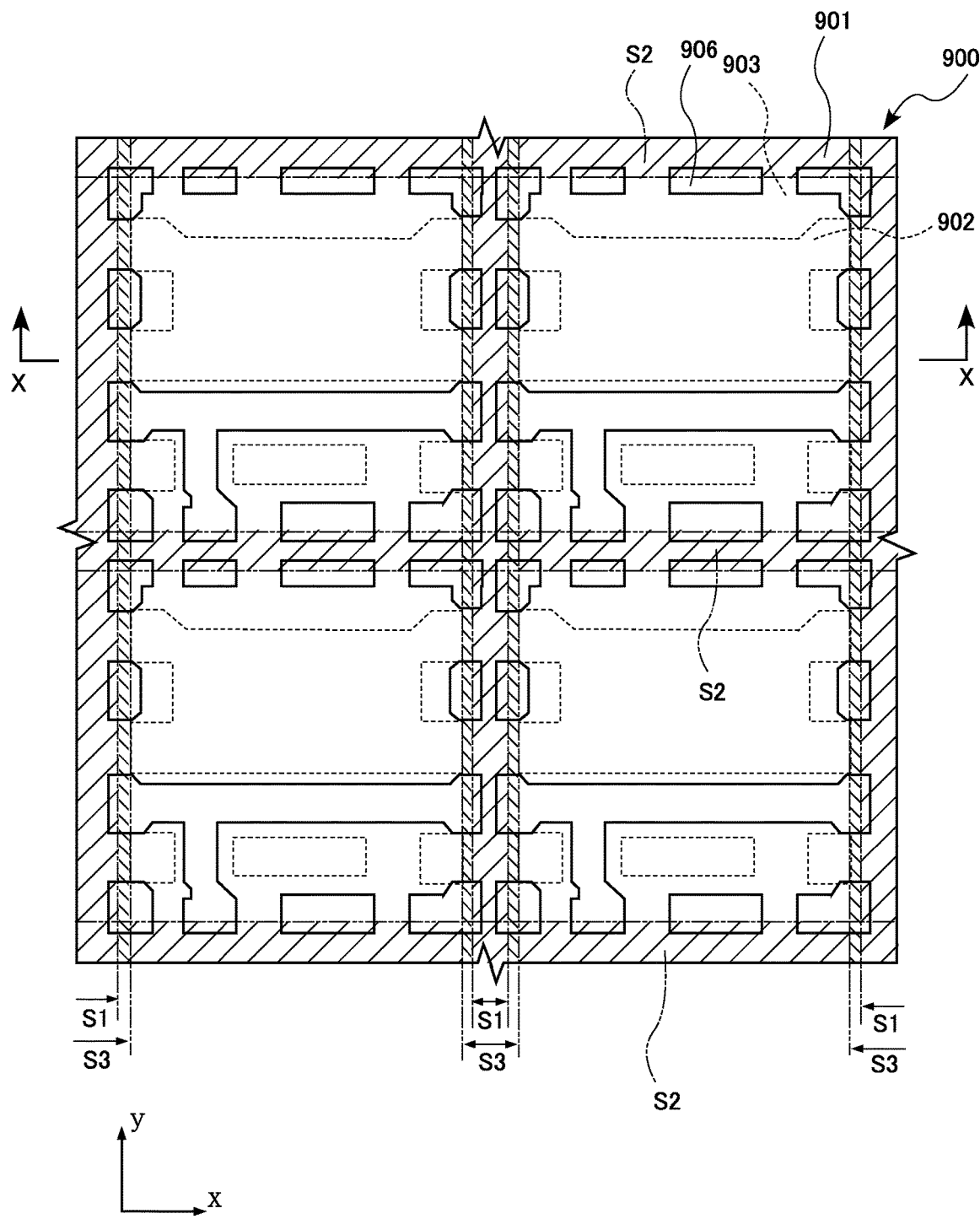
FIG. 9 is a plan view illustrating a manufacturing step of the semiconductor device shown FIG. 1.

First, a lead frame 900 is prepared as shown in FIG. 9 (preparing step). The lead frame 900 is a plate-like component from which the leads 1 to 3 will be formed. In the illustrated example, the base material of the lead frame 900 is made of Cu. The lead frame 900 may be formed by etching a metal plate. The lead frame 900 may be formed by different processing, for example, by stamping a metal plate. The lead frame 900 has an obverse surface 901, a reverse surface 902, recesses 903 and through holes 906.

The obverse surface 901 and the reverse surface 902 face opposite from each other in the z direction. The obverse surface 901, which faces upward in FIG. 10, will be formed into: the mount-portion obverse surface 111, the terminal-portion obverse surfaces 121 and the connecting-portion obverse surfaces 131 of the first lead 1; the wire-bonding-portion obverse surface 211, the terminal-portion obverse surface 221 and the connecting-portion obverse surfaces 231 of the second lead 2; and the wire-bonding-portion obverse surface 311, the terminal-portion obverse surface 321 and the connecting-portion obverse surface 331 of the third lead 3. The reverse surface 902, which faces downward in FIG. 10, will be formed into: the mount-portion reverse surface 112 and the terminal-portion reverse surfaces 122 of the first lead 1; the wire-bonding-portion reverse surface 212 and the terminal-portion reverse surface 222 of the second lead 2; and the wire-bonding-portion reverse surface 312 and the terminal-portion reverse surface 322 of the third lead 3.

The recesses 903 are portions recessed from the reverse surface 902 toward the obverse surface 901. The recesses 903 may be formed by half-etching, for example. The recesses 903 will be formed into: the mount-portion recess 113 and the connecting-portion reverse surfaces 132 of the first lead 1; the wire-bonding-portion recess 213 and the connecting-portion reverse surfaces 232 of the second lead 2; and the wire-bonding-portion recess 313 and the connecting-portion reverse surface 332 of the third lead 3. In FIG. 9, the boundaries between the reverse surface 902 and the recesses 903 are represented by broken lines. The through holes 906, which may be formed by etching, extend from the obverse surface 901 to the reverse surface 902 or to the recesses 903. Specifically, the base plate of the lead frame 900 is etched from both the obverse surface 901 and the reverse surface 902 to form the through holes 906, and only from the reverse surface 902 to form the recesses 903.

FIG. 9 shows some regions shaded with diagonal lines. Among the relatively lightly shaded regions, those extending in the y direction represent first removal regions S1. The first removal regions S1 are the regions to be removed in the first cutting step, which will be described later. The first removal regions S1 are determined to select from the lead frame 900 the regions elongated in the y direction between the adjacent regions in the x direction where the first leads 1 are to be formed. Among the relatively lightly shaded regions, those extending in the x direction represent second removal regions S2. The second removal regions S2 are the regions to be removed in the second cutting step, which will be described later. The second removal regions S2 are determined to select from the lead frame 900 the regions elongated in the x direction between the adjacent regions where the semiconductor devices A1 are to be formed. FIG. 9 also shows darker shaded regions flanking the relatively lightly shaded regions extending in the y direction (the first removal regions S1). The darker shaded regions and the first removal regions S1 together represent trench forming regions S3 where trenches are to be formed on the reverse surface 902 in the trench forming step, which will be described later. The trench forming regions S3 are determined to select from the lead frame 900 the regions elongated in the y direction between the adjacent regions in the x direction where the first leads 1 are to be formed. Each trench forming region S3 has a width (x-direction dimension) greater than a first removal region S1 and contains a first removal region S1 in the widthwise center. In other words, each first removal region S1 is narrower than a trench forming region S3 and entirely overlaps with the trench forming region S3.

Figure 10:
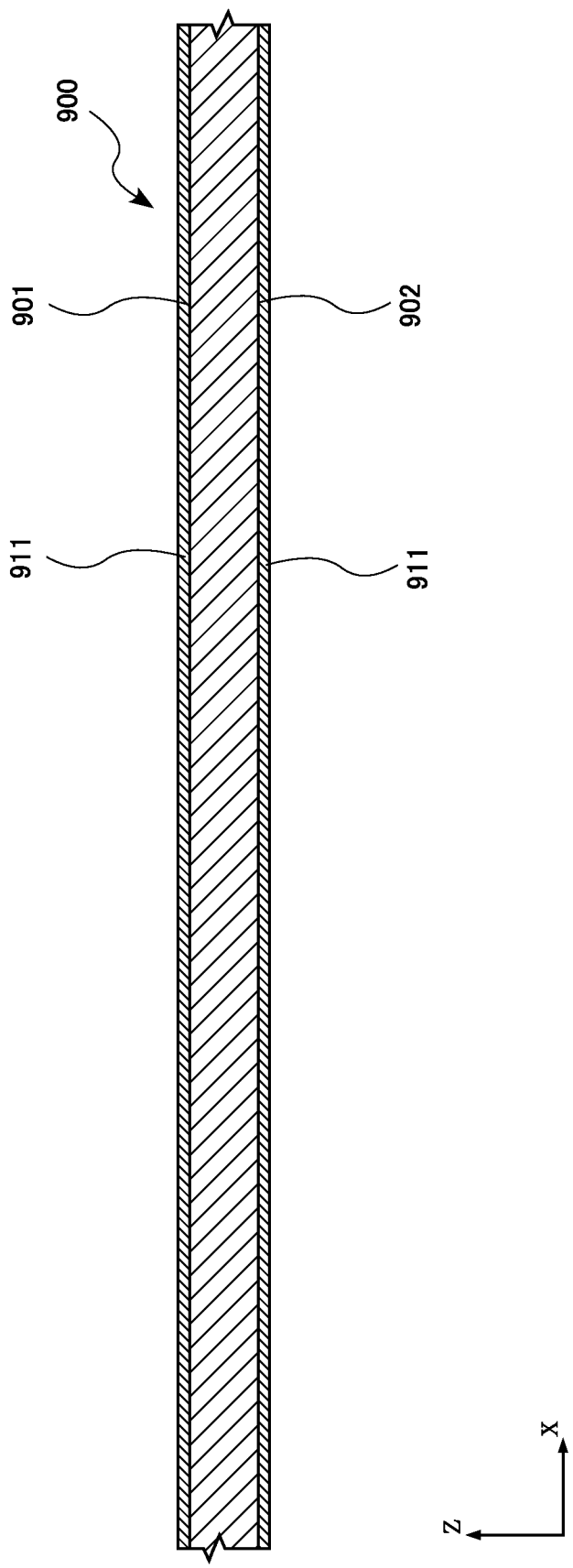
FIG. 10 is a sectional view illustrating a manufacturing step of the semiconductor device shown FIG. 1.

Subsequently, a first plating layer 911 is formed on all the surfaces of the lead frame 900 as shown in FIG. 10 (first plating step). The first plating layer 911 is formed by electrolytic plating using the lead frame 900 as a conduction path. The first plating layer 911 may be formed by electroless plating. In the illustrated example, the first plating layer 911 is formed by depositing a Ni plating layer 411, a Pd plating layer 412 and a Au plating layer 413 in sequence. The first plating layer 911 is formed on the obverse surface 901, the reverse surface 902, the recesses 903, and the inner surfaces of the through holes 906. The first plating layer 911 will be formed into the first plating layer 41.

Figure 11:
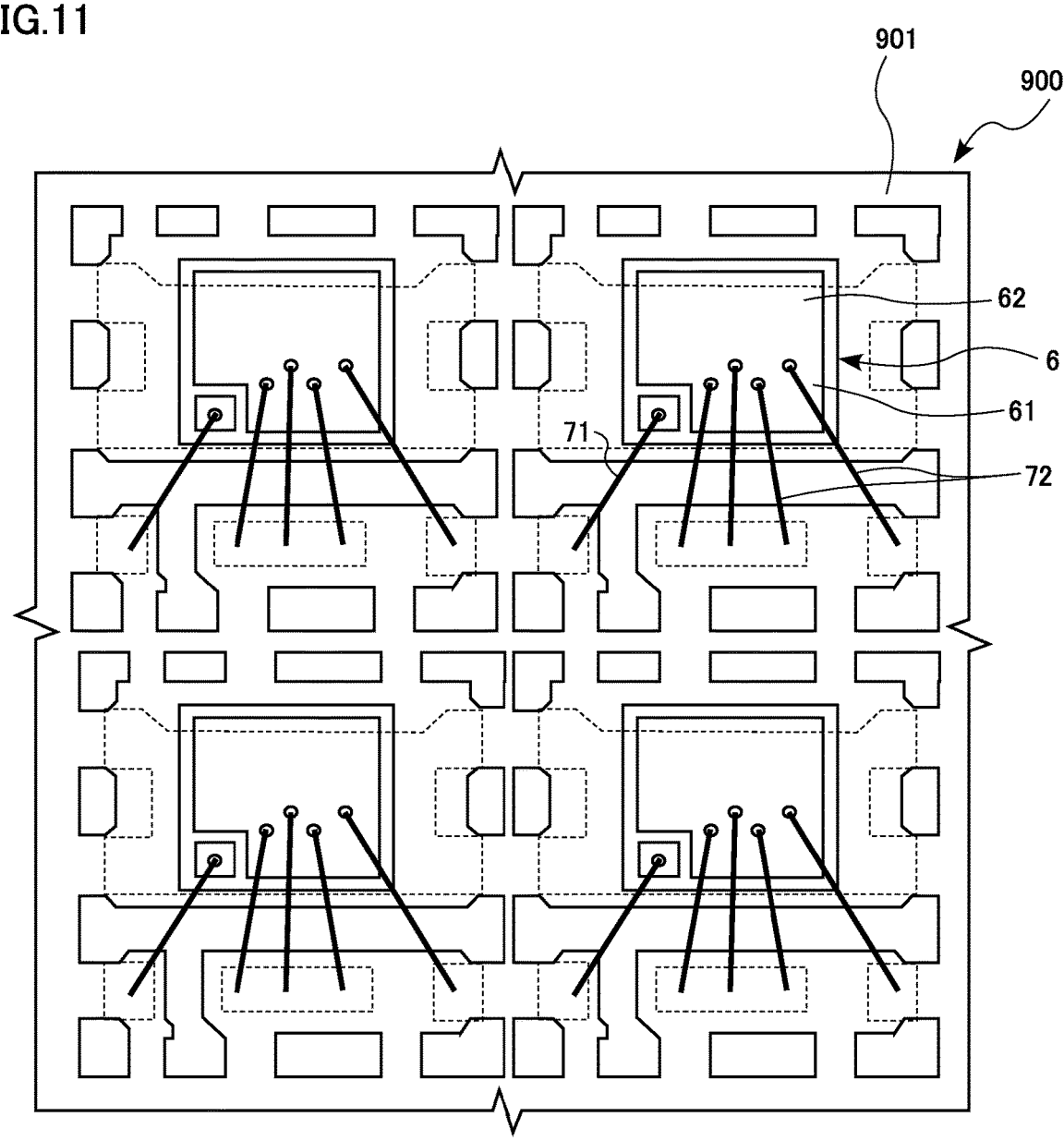
FIG. 11 is a plan view illustrating a manufacturing step of the semiconductor device shown FIG. 1.
Figure 11:
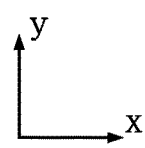

Subsequently, semiconductor elements 6 are mounted on the lead frame 900 as shown in FIG. 11 (mounting step). The mounting step starts with bonding the semiconductor elements 6 to the obverse surface 901 of the lead frame 900 using an electrically conductive bonding material. Each semiconductor element 6 is placed on a region of the obverse surface 901 where the mount-portion obverse surface 111 of the first lead 1 will be formed. Then, a bonding wire 71 is bonded to connect the first electrode 61 of the semiconductor element 6 to a region where the wire-bonding-portion obverse surface 311 of the third lead 3 will be formed. Also, a plurality of bonding wires 72 are bonded to connect the second electrode 62 of the semiconductor element 6 to a region where the wire-bonding-portion obverse surface 211 of the second lead 2 will be formed. Since the obverse surface 901 of the lead frame 900 is coated with the first plating layer 911, good adhesion of the bonding wires 71 and 72 is ensured.

Figure 12:
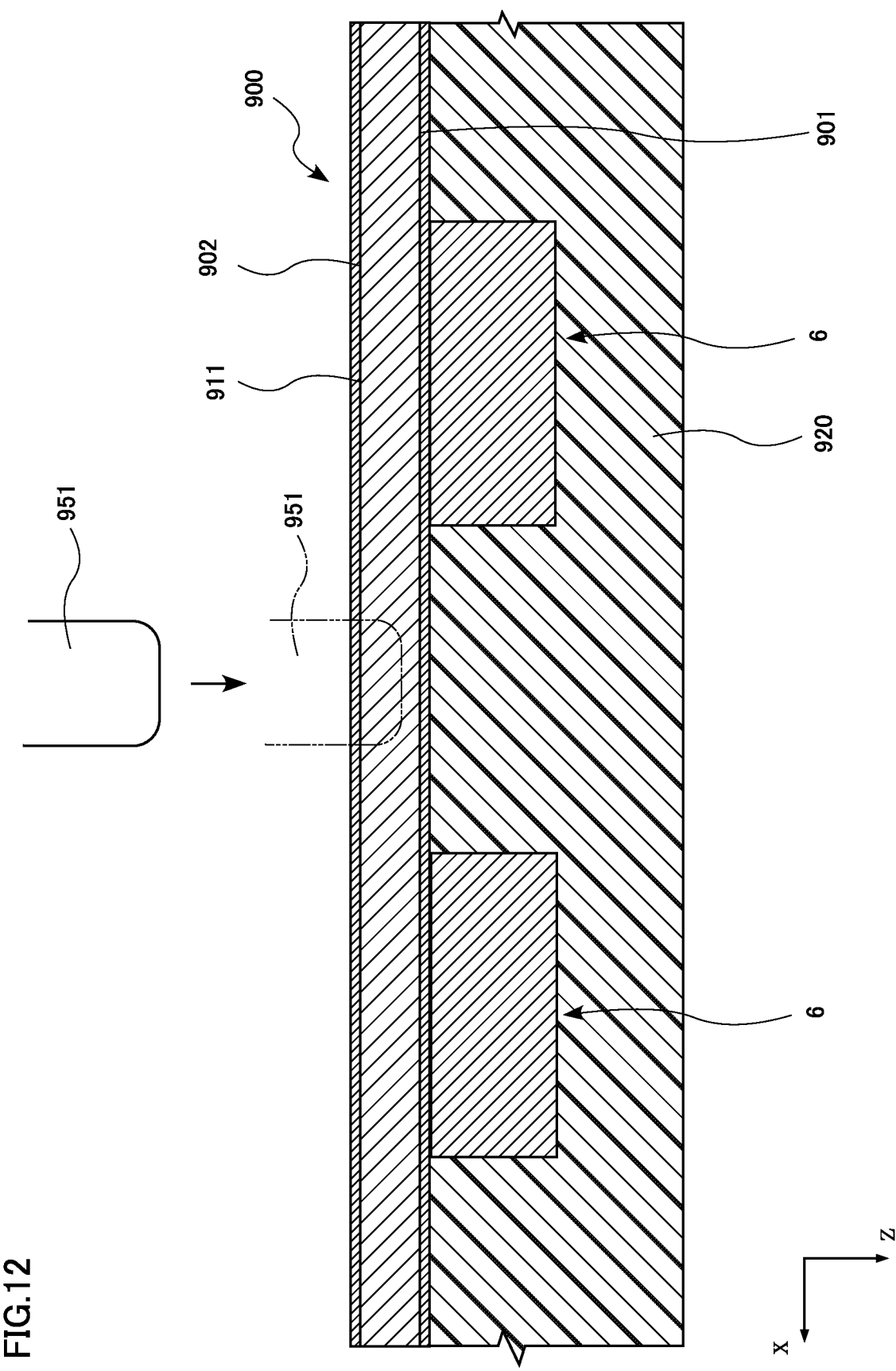
FIG. 12 is a sectional view illustrating a manufacturing step of the semiconductor device shown FIG. 1.

Subsequently, a resin material is cured as shown in FIG. 12 to form a sealing resin 920 covering portions of the lead frame 900, together with the semiconductor elements 6, the bonding wires 71 and 72 (resin forming step). The sealing resin 920 is made of a black epoxy resin, for example. In the resin forming step, the lead frame 900 is set in a metal mold with the reverse surface 902 in contact with the metal mold, and a resin material in a fluid state is injected into the metal mold. The thus formed sealing resin 920 does not cover the reverse surface 902 of the lead frame 900. In addition, a surface of the sealing resin 920 facing in the same side as the reverse surface 902 is formed to be flush with the reverse surface 902. The recesses 903 are filled with the sealing resin 920 because the resin material flows into hollows between the metal mold and the recesses 903. The sealing resin 920 will be formed into sealing resins 8.

Figure 13:
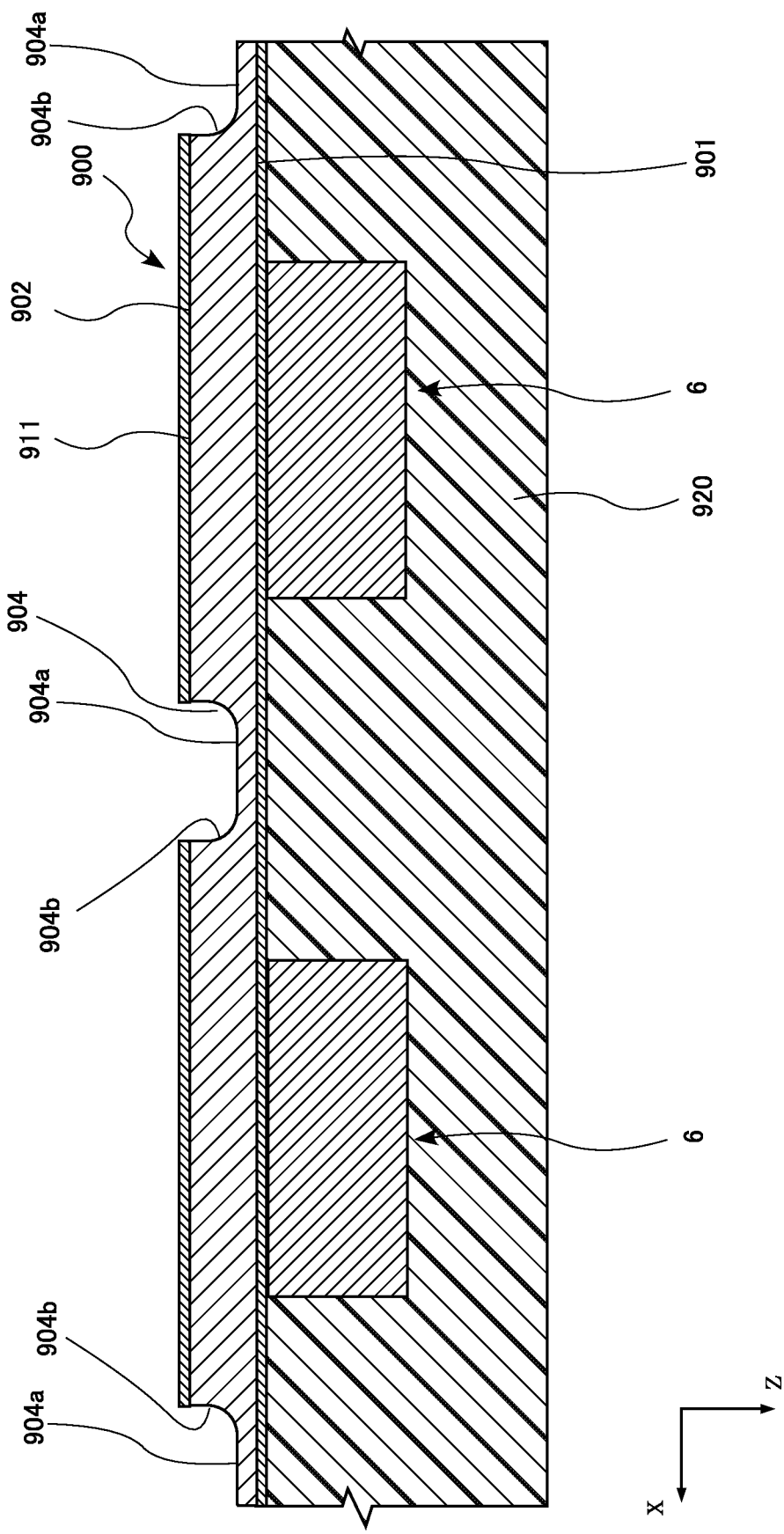
FIG. 13 is a sectional view illustrating a manufacturing step of the semiconductor device shown FIG. 1.

Subsequently, trenches 904 are formed as shown in FIG. 13 (trench forming step). The trenches 904 are recessed from the reverse surface 902 to a depth partway to the obverse surface 901 and extend in the y direction. The trenches 904 are formed in the regions corresponding to the trench forming regions S3 shown in FIG. 9. The trenches 904 are formed on both the lead frame 900 and the sealing resin 920. Each trench 904 has a bottom surface 904a and side surfaces 904b. The bottom surface 904a faces the same side as the reverse surface 902 of the lead frame 900. The side surface 904b connects the bottom surface 904a to the reverse surface 902 of the lead frame 900 and also to the surface of the sealing resin 920 facing the same side as the reverse surface 902. The trenches 904 will form terminal-portion recesses 124 at the regions of the lead frame 900 where the terminal portions 120 of first leads 1 are to be formed. Similarly, the trenches 904 will form terminal-portion recesses 224 at the regions where the terminal portions 220 of second leads are to be formed. Similarly, the trenches 904 will form terminal-portion recesses 324 at the regions where the terminal portions 320 of third leads 3 are to be formed. Portions of the trenches 904 formed in the sealing resin 920 will form resin recesses 85.

The trench forming step is carried out by half-cut dicing of cutting the reverse surface 902 of the lead frame 900 with a first blade 951 as shown in FIG. 12. The first blade 951 has a thickness (x-direction dimension) matched to the x-direction dimension of the trench forming regions S3. In the half-cut dicing, portions of the lead frame 900 are removed from the reverse surface 902 at regions corresponding to the trench forming regions S3 shown in FIG. 9. In the half-cut dicing, the lead frame 900 is cut partway in the z direction (see the first blade 951 shown by the double-dot line in FIG. 12). The cutting depth may be at least one half of, in one example about three quarters, of the thickness (z-direction dimension) of the lead frame 900. In the example shown in the figures, the reverse surface 902 of the lead frame 900 is coated with the first plating layer 911, so that formation of burrs resulting from cutting the lead frame 900 is reduced. In the trench forming step, the trenches 904 may be may formed by a process other than half-cut dicing with a blade.

Figure 14:
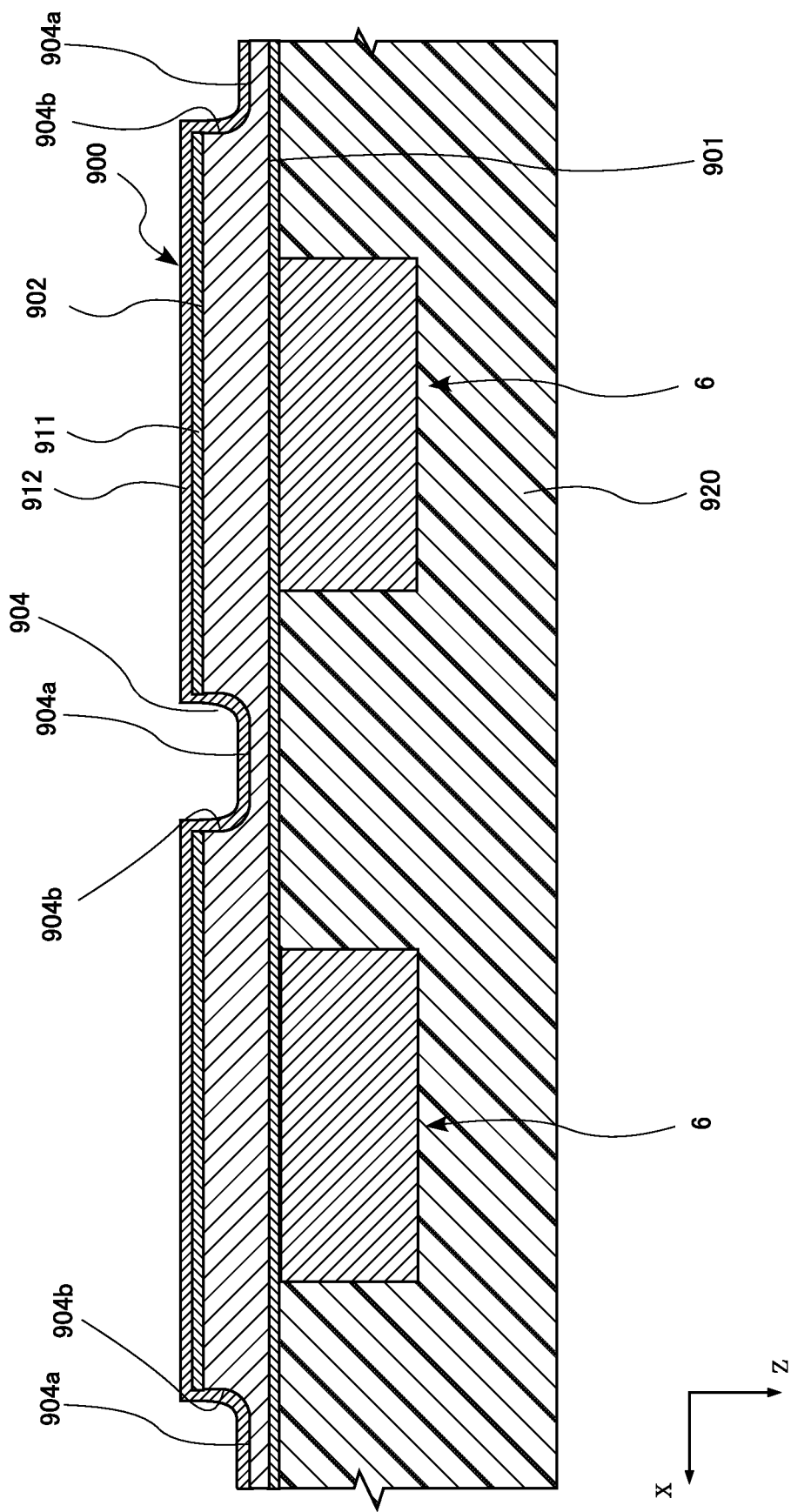
FIG. 14 is a sectional view illustrating a manufacturing step of the semiconductor device shown FIG. 1.

Subsequently, a second plating layer 912 is formed as shown in FIG. 14 (second plating step). The second plating layer 912 is formed by electrolytic plating using the lead frame 900 as a conduction path. The second plating layer 912 may be formed by electroless plating. The second plating layer 912 is formed on regions of the lead frame 900 not covered by the sealing resin 920. That is, the second plating layer 912 is formed on the first plating layer 911 covering the reverse surface 902, and also on the bottom surfaces 904a and the side surfaces 904b of the trenches 904. The second plating layer 912 will be formed into the second plating layers 42.

Figure 15:
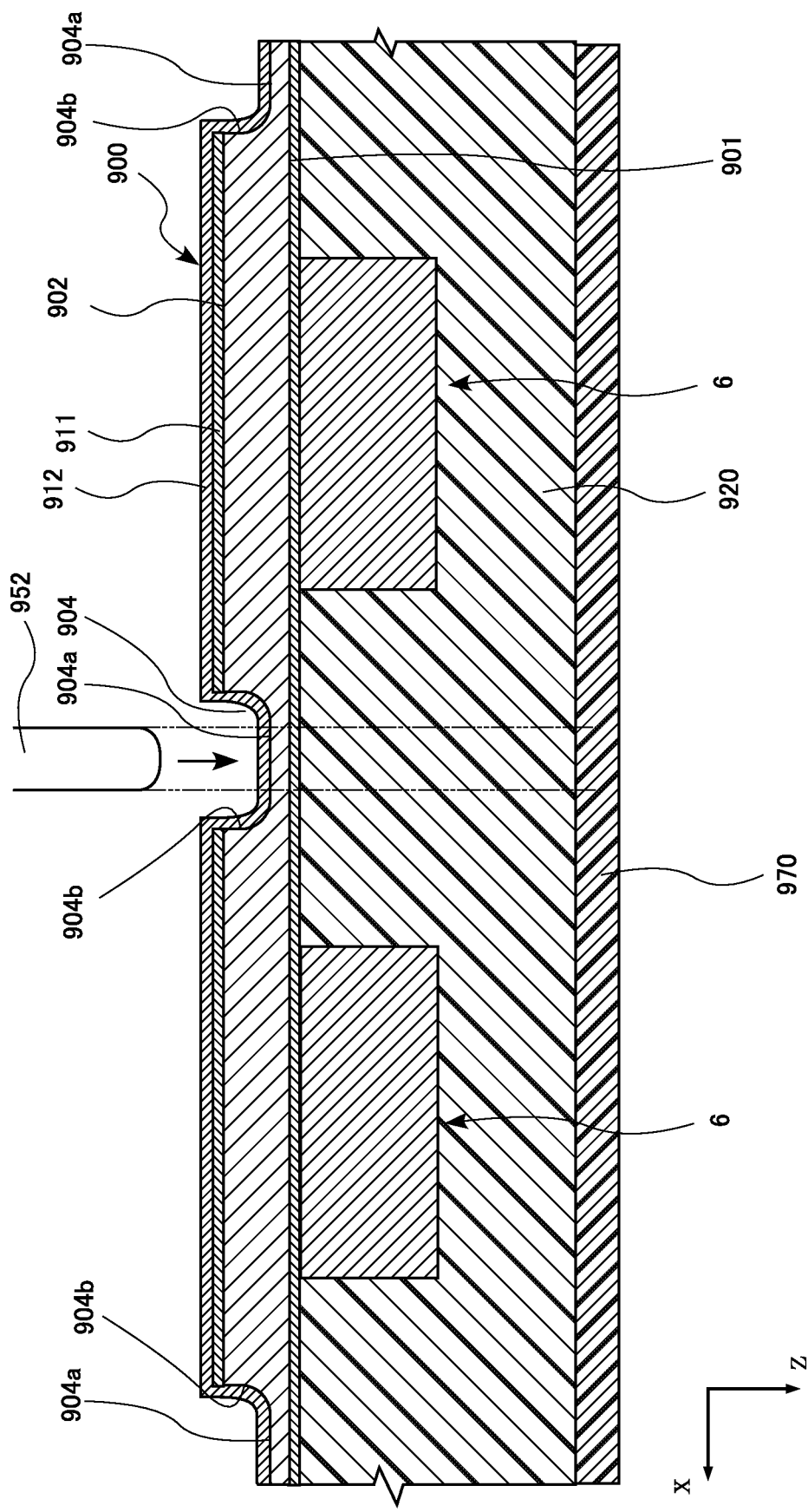
FIG. 15 is a sectional view illustrating a manufacturing step of the semiconductor device shown FIG. 1.

Next, a protective tape 970 is applied to the surface of the sealing resin 920 facing the same side as the obverse surface 901 of the lead frame 900 as shown in FIG. 15. The protective tape 970 will hold together individual pieces cut in the first and second cutting steps, which will be described later.

Figure 16:
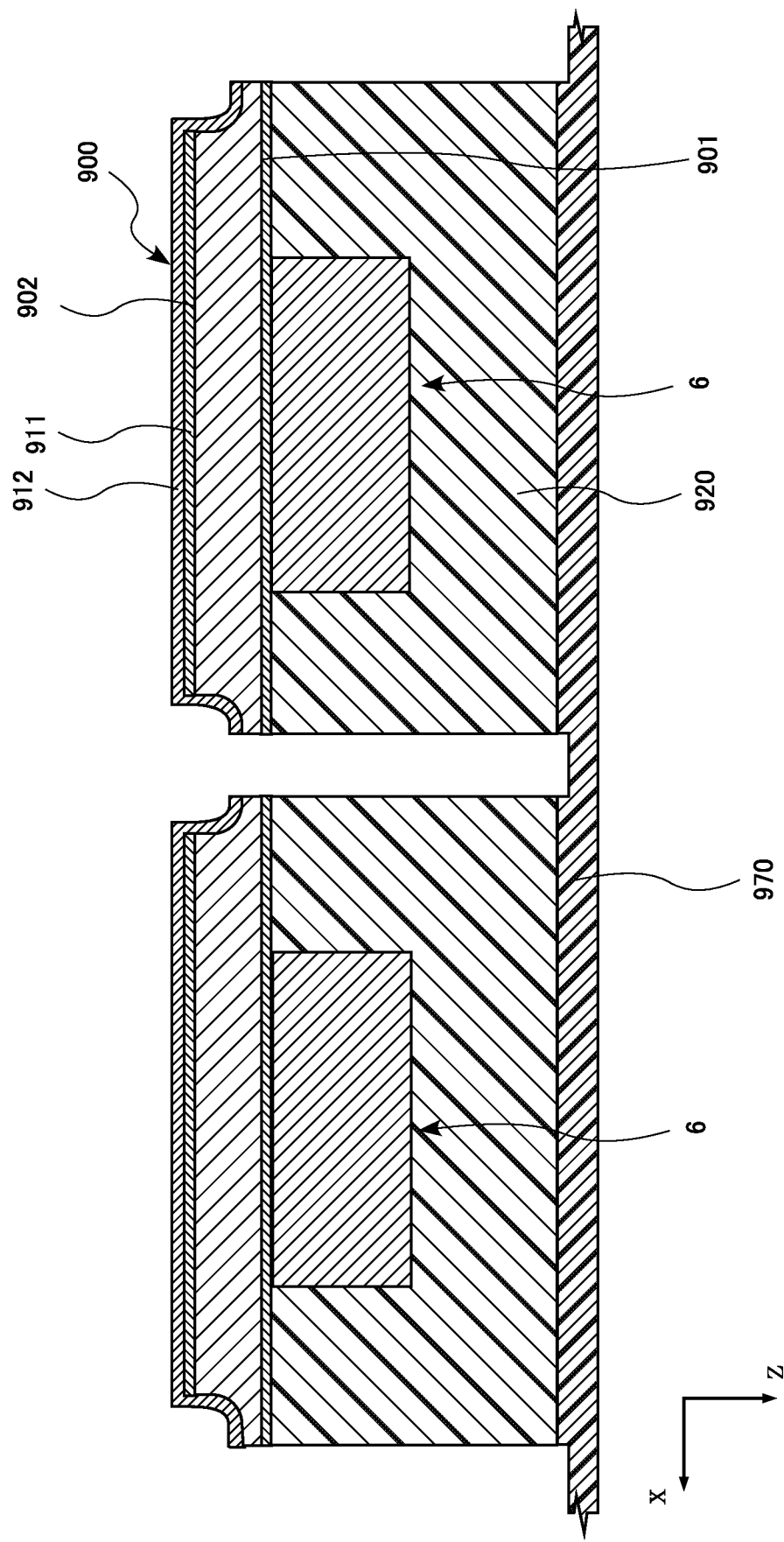
FIG. 16 is a sectional view illustrating a manufacturing step of the semiconductor device shown FIG. 1.

Subsequently, as shown in FIG. 16, the lead frame 900 and the sealing resin 920 are cut in the y direction, without cutting the protective tape 970 (first cutting step). The first cutting step is carried out by full-cut dicing of the lead frame 900 from the reverse surface 902 with a second blade 952 as shown in FIG. 15. The second blade 952 has a thickness (x-direction dimension) matched to the x-direction dimension of the first removal regions S1. The second blade 952 is hence thinner than the first blade 951 used in the trench forming step. In the full-cut dicing process, the lead frame 900 is cut from the reverse surface 902 until the protective tape 970 is reached, thereby to remove regions corresponding to the first removal regions S1 of FIG. 9. As a result, the regions of the lead frame 900 and the sealing resin 920 overlapping with the first removal regions S1 as viewed in the z direction are fully removed in the z direction. This provides the lead frame 900 with freshly cut surfaces facing in the x direction. The freshly cut surfaces will form terminal-portion end surfaces 123 at the regions where the terminal portions 120 of first leads 1 are to be formed. Similarly, the freshly cut surfaces will form the terminal-portion end surfaces 223 at the regions where the terminal portions 220 of second leads 2 are to be formed. The freshly cut surfaces will form the terminal-portion end surfaces 323 at the regions where the terminal portions 320 of third leads 3 are to be formed. The cut surfaces of the sealing resin 920 will form the resin second side surfaces 84. In the example shown in the figures, the trenches 904 of the lead frame 900 are coated with the second plating layer 912, which is effective to reduce formation of burrs at the time of cutting the lead frame 900. The first cutting step may employ a process other than the full-cut dicing with a blade. For example, the first cutting step may employ plasma dicing or laser dicing. In the first cutting step, the lead frame 900 and the sealing resin 920 are cut into pieces separated in the x direction.

Subsequently, the lead frame 900 and the sealing resin 920 are cut in the x direction, without cutting the protective tape 970 (second cutting step). In the illustrated example, the second cutting step is carried out by full-cut dicing in which the lead frame 900 is cut from the reverse surface 902 with the second blade 952. In the full-cut dicing process, the lead frame 900 is cut from the reverse surface 902 to remove regions corresponding to the second removal regions S2 of FIG. 9. As a result, the regions of the lead frame 900 and the sealing resin 920 overlapping with the second removal regions S2 as viewed in the z direction are fully removed in the z direction. This provides the lead frame 900 with freshly cut surfaces facing in the y direction. The freshly cut surfaces will form the connecting-portion end surfaces 133 at the regions where the connecting portions 130 of first leads 1 are to be formed. Similarly, the freshly cut surfaces will form the connecting-portion end surfaces 233 at the regions where the connecting portions 230 of second leads 2 are to be formed. The freshly cut surfaces will form the connecting-portion end surfaces 333 at the regions where the connecting portions 330 of third leads 3 are to be formed. The cut surfaces of the sealing resin 920 will form the resin first side surfaces 83. Since the recesses 903 of the lead frame 900 are coated with the first plating layer 911, formation of burrs resulting from cutting the lead frame 900 is reduced. The second cutting step may employ a process other than the full-cut dicing with a blade. For example, the second cutting step may employ plasma dicing or laser dicing. In the second cutting step, the lead frame 900 and the sealing resin 920 are cut into pieces separated in the y direction. As a result, the individual semiconductor elements 6 are cut into separate chips but held together by the protective tape 970.

Then, the protective tape 970 is removed. As a result, the individual chips of the semiconductor elements 6 are separated. Through the above processing steps, the semiconductor devices A1 as shown in FIGS. 1 to 7 is obtained.

The following describes advantages of a semiconductor device A1.

According to the embodiment described above, the first plating layer 41 is provided in contact with the obverse surfaces and the reverse surfaces of the leads 1 to 3. The first plating layer 41 is formed in the first plating step by forming a layer on all the surfaces of the lead frame 900. In addition, the second plating layer 42 is provided in contact with the regions of the first plating layer 41 laid on the reverse surfaces of the leads 1 to 3 and also with the terminal-portion recesses 124, 224 and 324. The second plating layer 42 is formed in the second plating step by forming a layer on the regions of the first plating layer 911, which are laid on the reverse surface 902 of the lead frame 900, and the trenches 904. That is, the manufacturing process for the semiconductor device A1 includes two plating steps, namely the first plating step and the second plating step. As such, the manufacturing process is simplified as compared with the manufacturing of a conventional semiconductor device requiring three plating steps. In addition, since the first plating step is performed to form the first plating layer 911 on all the surfaces of the lead frame 900, masking is not necessary. This allows the manufacturing cost to be reduced as compared with the case where an Ag plating layer needs to be formed on the limited regions where bonding wires are to be bonded.

According to the embodiment described above, the first plating layer 911 is formed on the reverse surface 902 of the lead frame 900 in the first plating step. This ensures that formation of burrs resulting from cutting the lead frame 900 is reduced in the trench forming step. In the second plating step, in addition, the second plating layer 912 is formed on the bottom surfaces 904a of the trenches 904. This ensures that formation of burrs resulting from cutting the lead frame 900 is reduced in the first cutting step. In the first plating step, in addition, the first plating layer 911 is also formed on the recesses 903 of the lead frame 900. This ensures that formation of burrs resulting from cutting the lead frame 900 is reduced in the second cutting step.

According to the embodiment described above, the first plating layer 911 is formed on the obverse surface 901 of the lead frame 900 in the first plating step. This provides the first plating layer 41 on the wire-bonding-portion obverse surfaces 211 and 311 to improve the adhesion to the bonding wires 71 and 72.

According to the embodiment described above, the second plating layer 42 is formed on the terminal-portion recesses 124, 224 and 324. Consequently, when the semiconductor device A1 is mounted on a circuit board, the second plating layer 42 will form solder fillets along the terminal-portion recesses 124, 224 and 324. This serves to increase the bonding strength of the semiconductor device A1 to the circuit board. In addition, the bonding state of the leads 1 to 3 to the circuit board can be easily determined by visual inspection.

Figure 17:
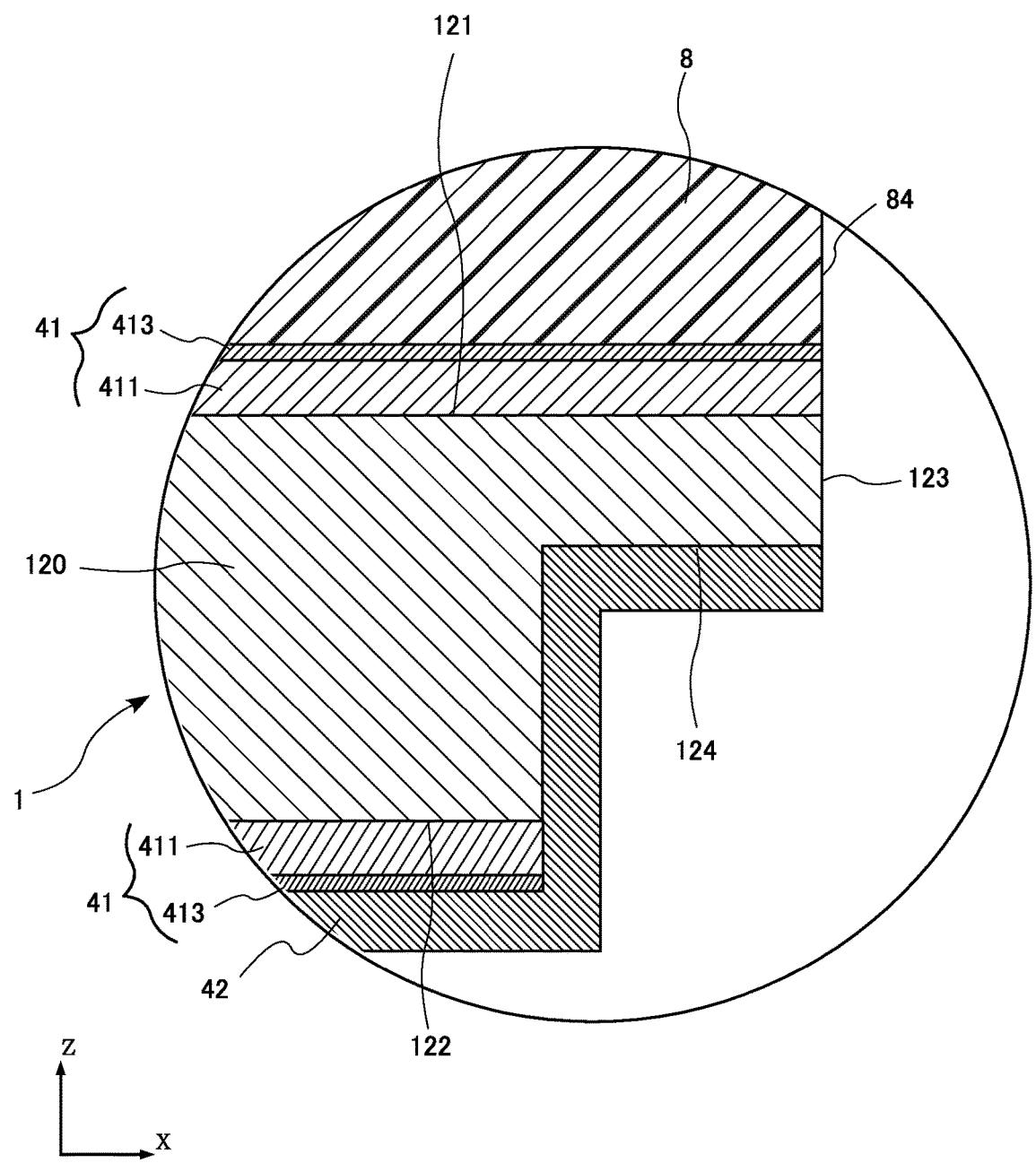
FIG. 17 is an enlarged fragmentary view of a variation of the semiconductor device shown FIG. 1.
Figure 18:
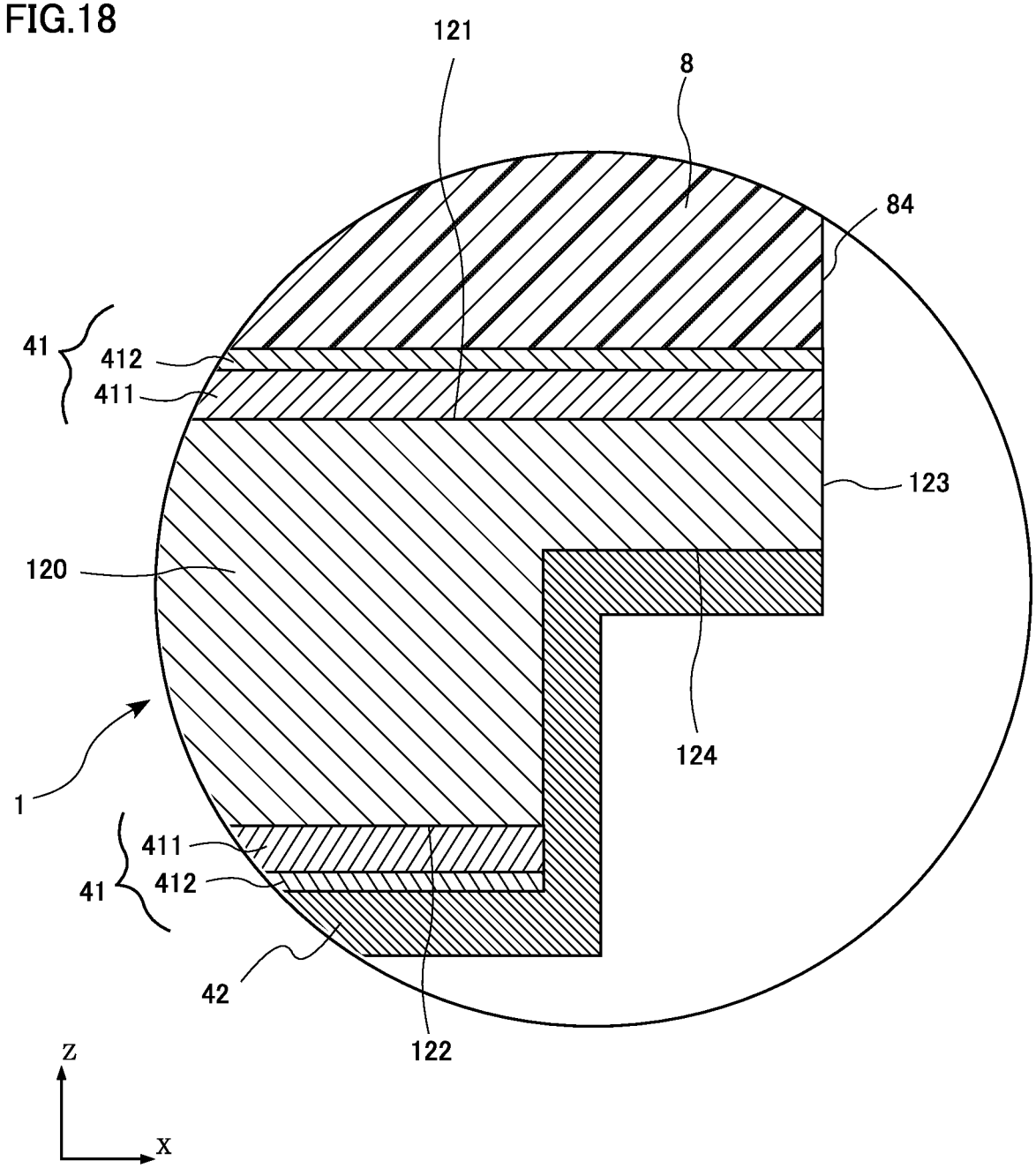
FIG. 18 is an enlarged fragmentary view of a variation of the semiconductor device shown FIG. 1.
Figure 19:
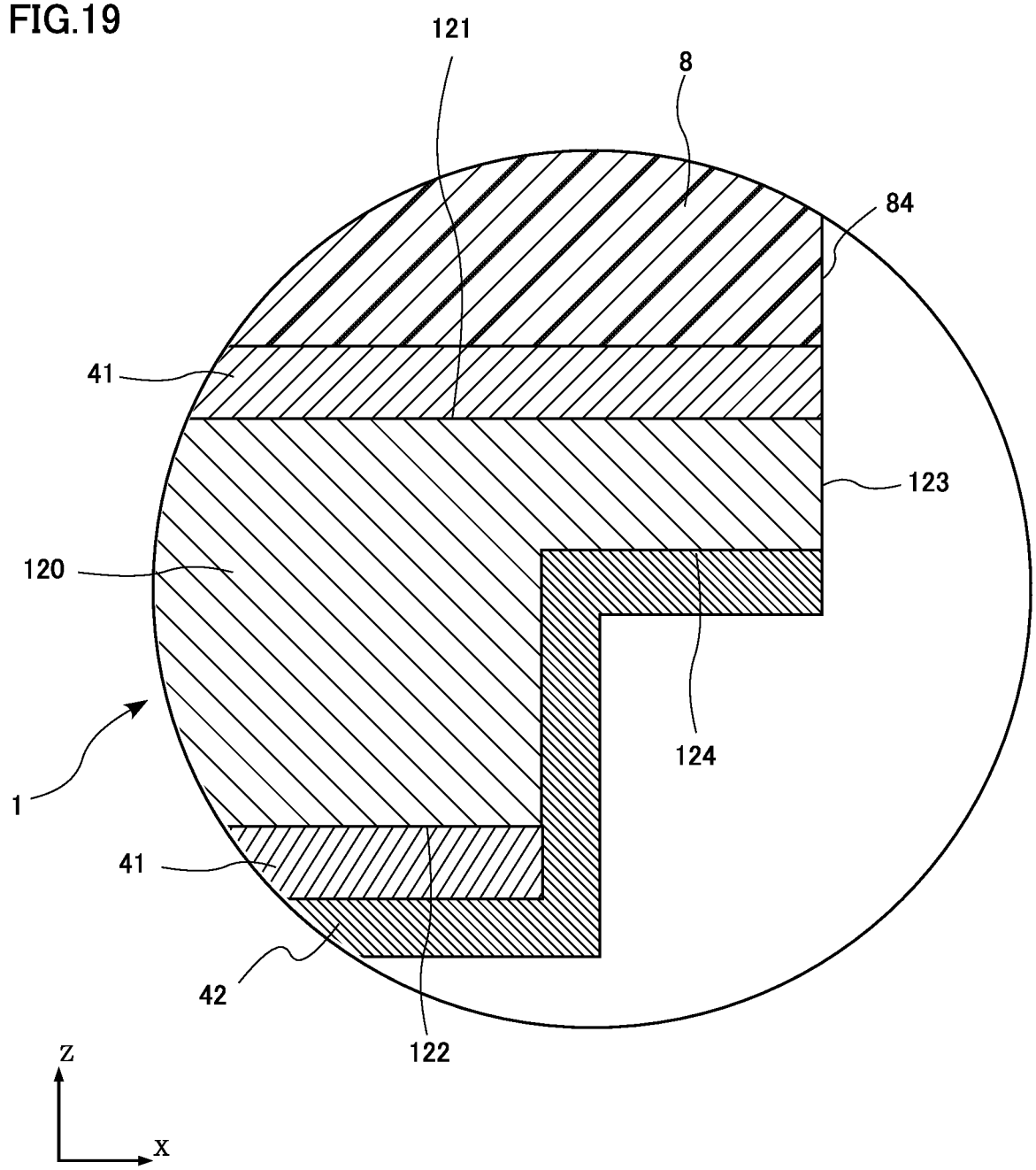
FIG. 19 is an enlarged fragmentary view of a variation of the semiconductor device shown FIG. 1.

According to the embodiment described above, each first plating layer 41 is a stack of a Ni plating layer 411, a Pd plating layer 412 and a Au plating layer 413. The first plating layer 41 is not limited to such. In a different example shown in FIG. 17, the first plating layer 41 is stack of a Ni plating layer 411 and a Au plating layer 413, without a Pd plating layer 412. In a yet another example shown in FIG. 18, the first plating layer 41 is a stack of a Ni plating layer 411 and a Pd plating layer 412, without a Au plating layer 413. In a yet another example shown in FIG. 19, the first plating layer 41 is formed of a single plating layer, rather than a stack of a plurality of plating layers. The first plating layer 41 of such an example may be made of an Sn-based alloy. The first plating layer 41 of a various configuration is possible as long as formation of burrs is reduced as compared with cutting the lead frame 900 not provided with the first plating layer 41. Preferably, the first plating layers 41 are capable of making intimate contact with the leads 1 to 3 (lead frame 900) and providing good adhesion to the bonding wires 71 and 72.

According to the embodiment described above, the second plating layer 42 is made of an Sn-based alloy. However, the present disclosure is not limited to such. For example, the second plating layer 42 may be made of a Au-based alloy. In another example, the second plating layer 42 may be a stack of, for example, a Ni plating layer 411, a Pd plating layer 412 and a Au plating layer 413. The second plating layer 42 is sufficient as long as it is made of a material having higher solder wettability than the base material of the leads 1 to 3 (lead frame 900).

Figure 20:
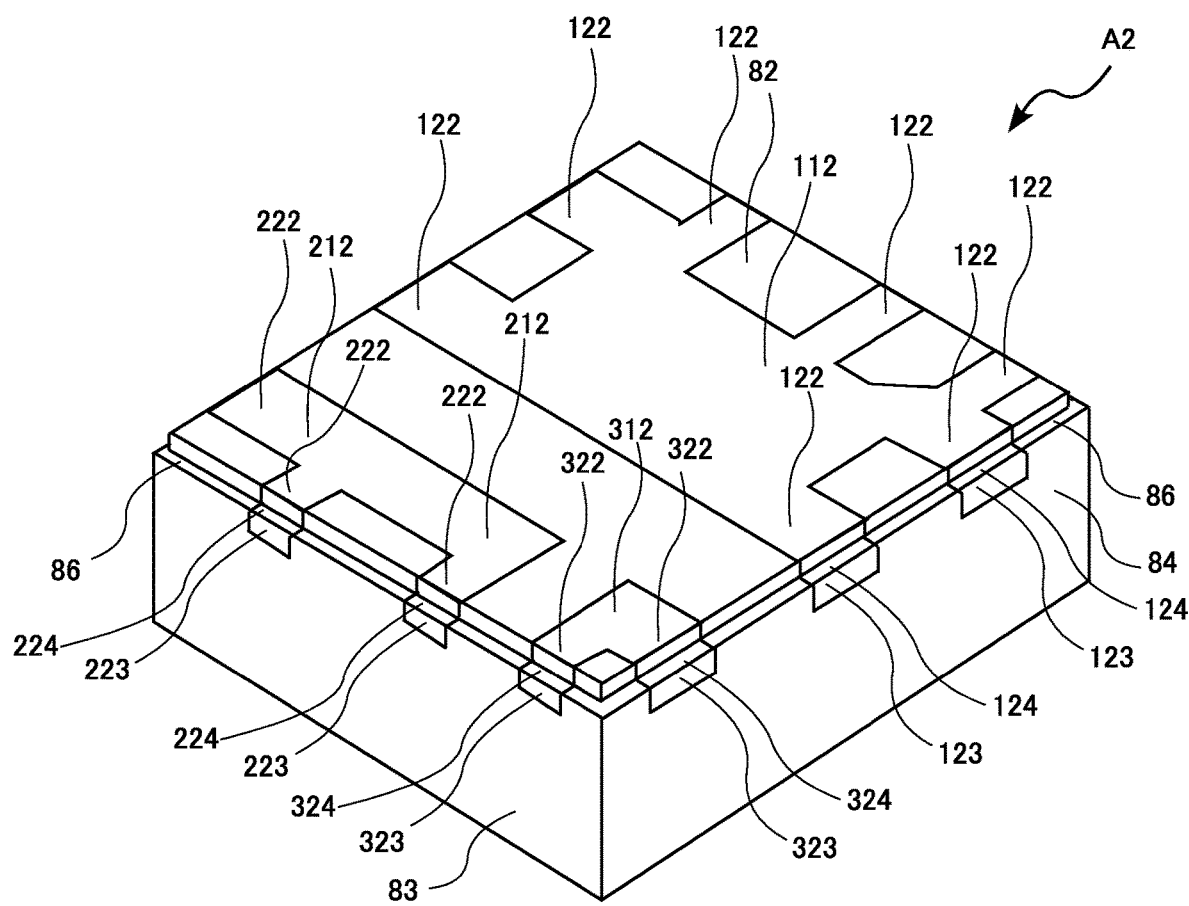
FIG. 20 is a perspective view of a semiconductor device according to a second embodiment, placed with the bottom side up.
Figure 21:
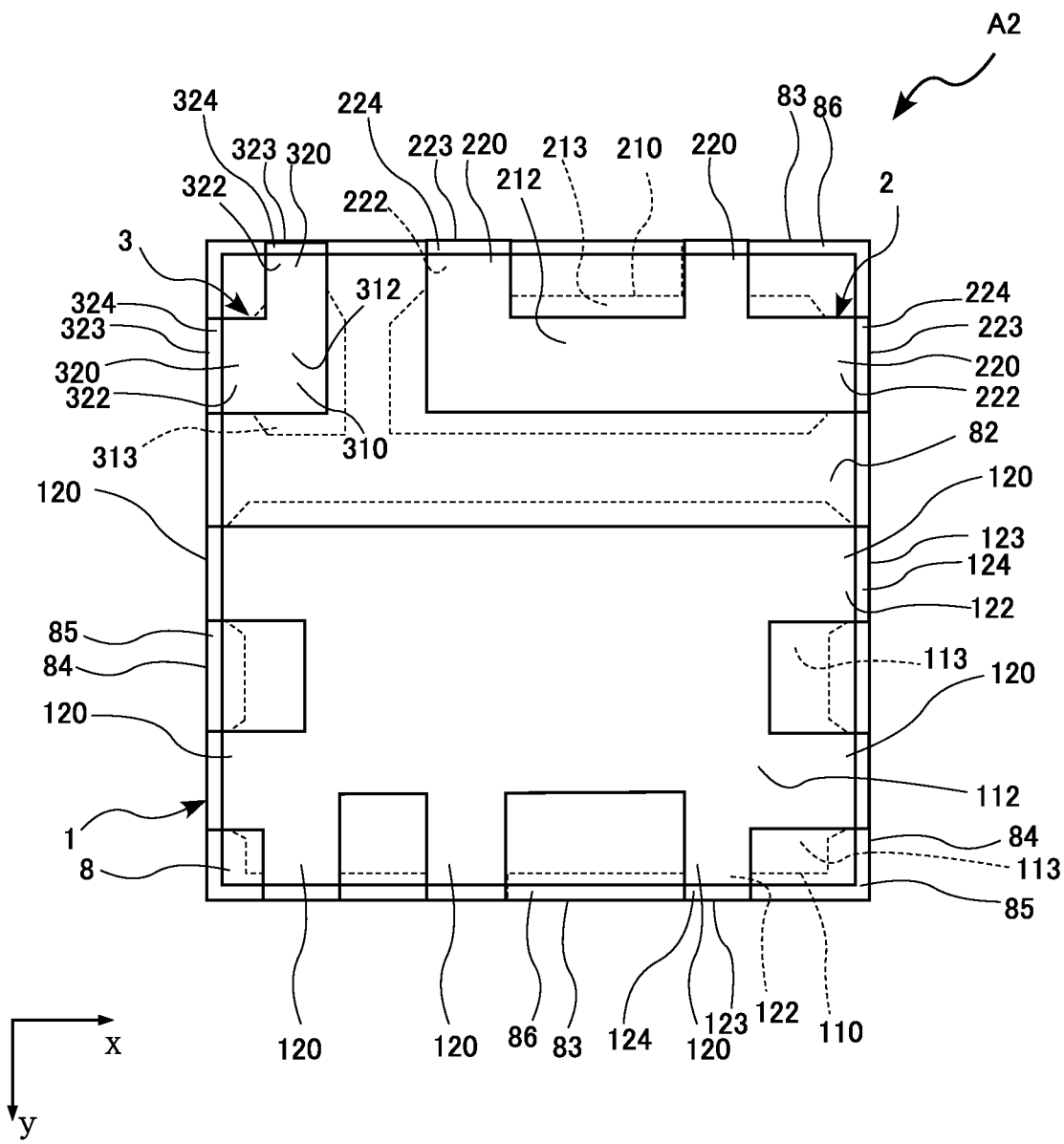
FIG. 21 is a bottom view of the semiconductor device shown FIG. 20.
Figure 22:
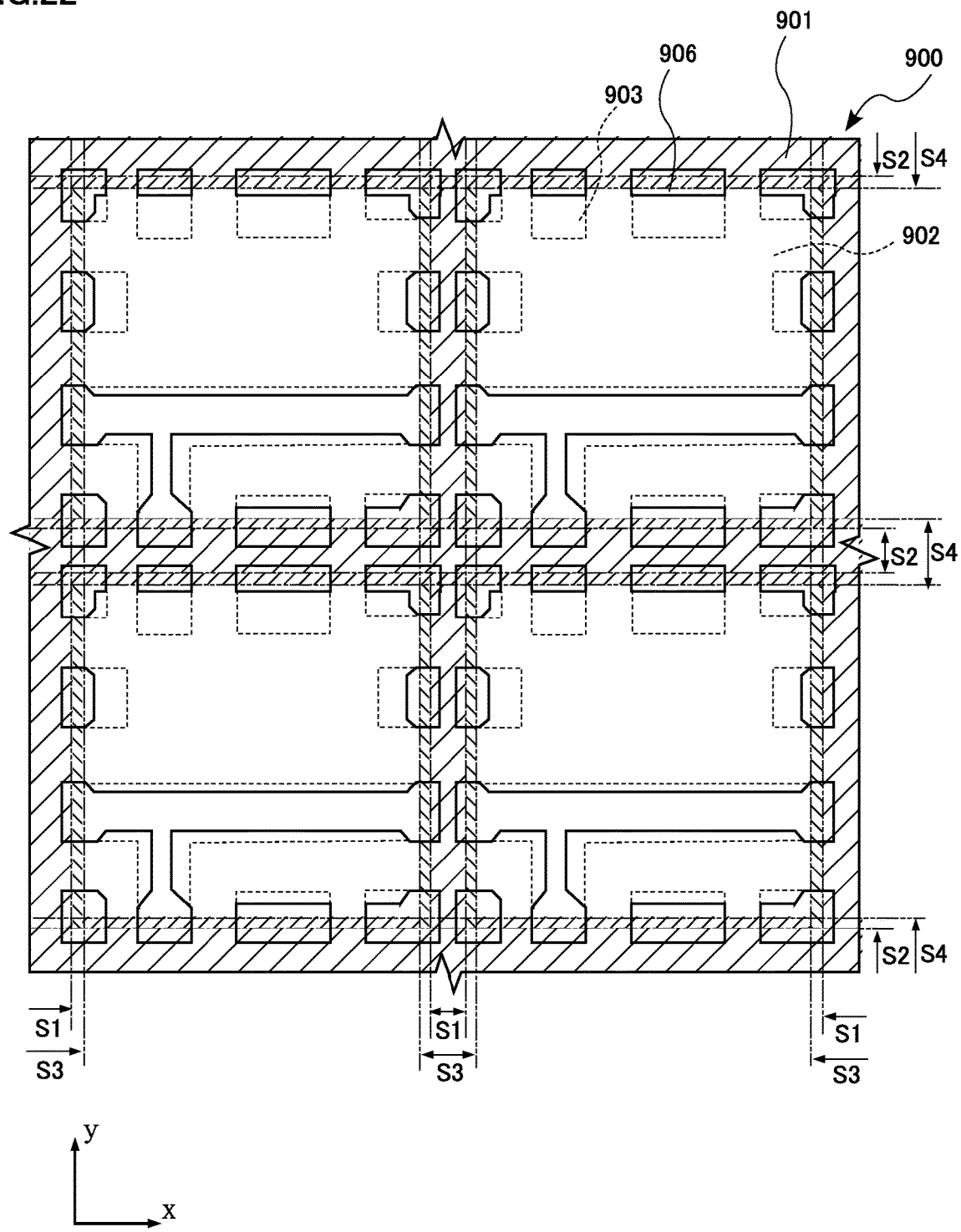
FIG. 22 is a plan view illustrating a manufacturing step of the semiconductor device shown FIG. 20.
Figure 23:
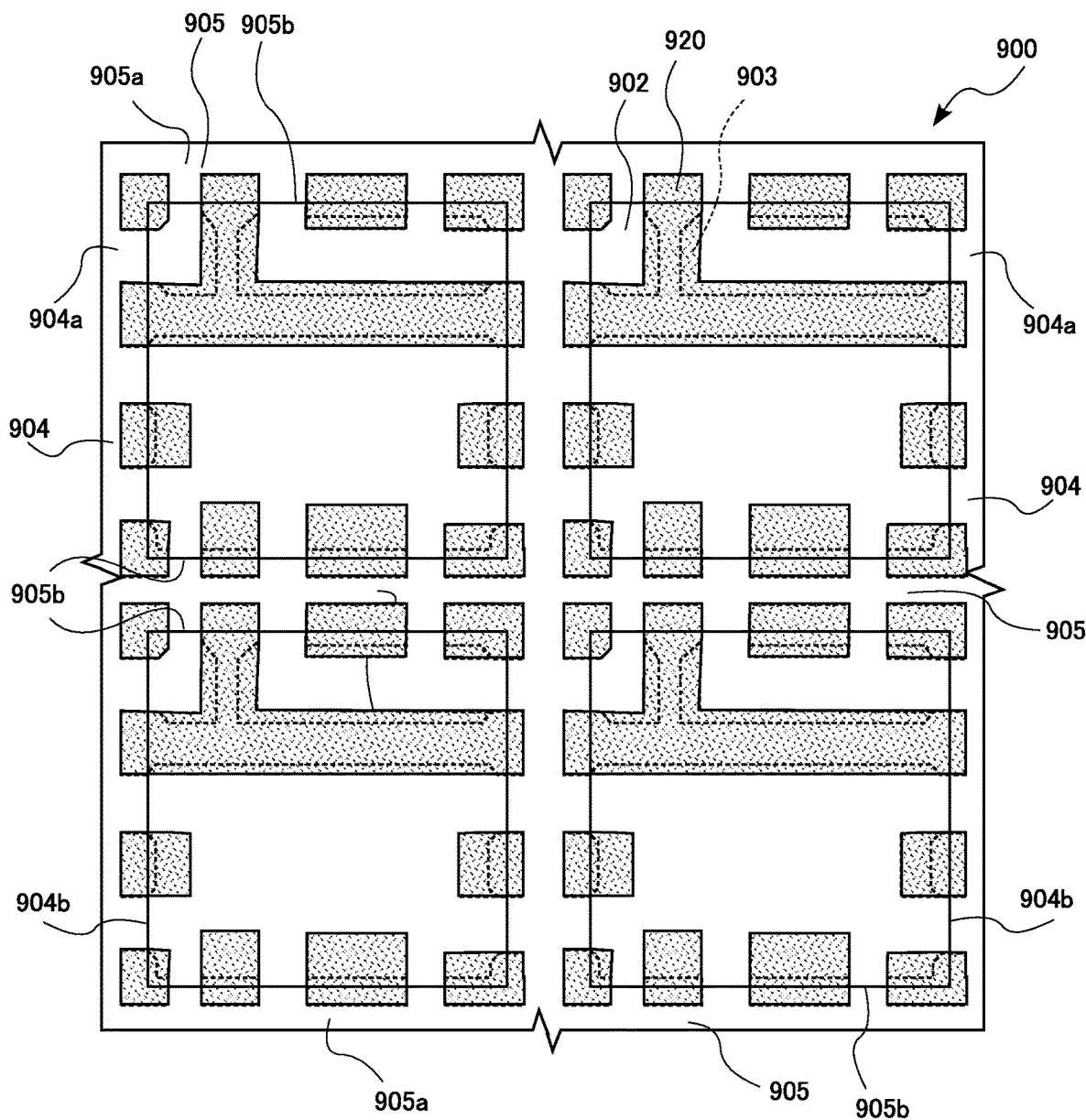
FIG. 23 is a bottom view illustrating a manufacturing step of the semiconductor device shown FIG. 20.

With reference to FIGS. 20 to 23, a semiconductor device A2 according to a second embodiment of the present disclosure will be described. In these figures, the same or similar elements to those of the semiconductor device A1 described above are denoted by the same reference signs and an overlapping description will not be given. FIG. 20 is a perspective view showing the semiconductor device A2, with the bottom side up. FIG. 21 is a bottom view showing the semiconductor device A2. FIG. 22 is a plan view showing a manufacturing step of the semiconductor device A2. FIG. 23 is a bottom view showing a manufacturing step of the semiconductor device A2.

Unlike the semiconductor device A1 of the first embodiment, the semiconductor device A2 shown in the figures includes additional terminal portions 120, 220, and 320 on the edges in the y direction, rather than only on the edges in the x direction. Consequently, the bottom surface of the semiconductor device A2 is recessed along the opposite edges in the y direction, in addition to the opposite edges in the x direction.

The first lead 1 of the semiconductor device A2 has the terminal portions 120 on the edges in the x direction and additional terminal portions 120 on an edge outward in the y direction. In other words, the additional terminal portions 120 are provided instead of the connecting portions 130. Each terminal portion 120 on the edge of the y direction is provided with a terminal-portion recess 124 formed in the terminal-portion reverse surface 122 along the edge outward in the y direction. In the manufacturing process, the terminal-portion recesses 124 are formed by half-cut dicing in a second trench forming step, which will be described later. Each terminal portion 120 provided at the edge in the y direction has a terminal-portion end surface 123, a terminal-portion reverse surface 122 and a terminal-portion recess 124 all of which are exposed from the sealing resin 8 to integrally serve as a terminal (see FIG. 21). The terminal-portion obverse surface 121 and the terminal-portion reverse surface 122 are coated with a first plating layer 41. The first plating layer 41 on the terminal-portion reverse surface 122 is further coated with a second plating layer 42 and the terminal-portion recess 124 is also coated with the second plating layer 42.

The second lead 2 of the semiconductor device A2 has the terminal portion 220 on an edge in the x direction and additional terminal portions 220 on an edge in the y direction. In other words, the additional terminal portions 220 are provided instead of the connecting portions 230. Each terminal portion 220 on the edge in the y direction has a terminal-portion reverse surface 222 provided with a terminal-portion recess 224 along the edge outward in the y direction. In manufacturing process, the terminal-portion recess 224 is formed by half-cut dicing in the second trench forming step, which will be described later. Each terminal portion 220 provided at the edge in the y direction has a terminal-portion end surface 223, a terminal-portion reverse surface 222 and a terminal-portion recess 224 all of which are exposed from the sealing resin 8 and integrally serve as a terminal (see FIG. 21). The terminal-portion obverse surface 221 and the terminal-portion reverse surface 222 are coated with a first plating layer 41. The first plating layer 41 on the terminal-portion reverse surface 322 is further coated with a second plating layer 42, and the terminal-portion recess 224 is also coated with the second plating layer 42.

The third lead 3 of the semiconductor device A2 has the terminal portion 320 on an edge in the x direction and an additional terminal portion 320 on an edge in the y direction. In other words, the additional terminal portion 320 is provided instead of the connecting portion 330. The terminal portion 320 on the edge in the y direction has a terminal-portion reverse surface 322 provided with a terminal-portion recess 324 along the edge outward in the y direction. In the manufacturing process, the terminal-portion recess 324 is formed by half-cut dicing in the second trench forming step, which will be described later. The terminal portion 320 on the edge in the y direction has a terminal-portion end surface 323, a terminal-portion reverse surface 322 and a terminal-portion recess 324 all of which are exposed from the sealing resin 8 and integrally serve as a terminal (see FIG. 21). The terminal-portion obverse surface 321 and the terminal-portion reverse surface 322 are coated with a first plating layer 41. The first plating layer 41 on the terminal-portion reverse surface 322 is further coated with a second plating layer 42, and the terminal-portion recess 324 is also coated with the second plating layer 42.

The sealing resin 8 of the semiconductor device A2 has resin recesses 86. The resin recesses 86 are portions recessed from the resin reverse surface 82 toward the resin obverse surface 81. In x direction, the resin recesses 86 extend from one end to the other end of the resin reverse surface 82 along the opposite edges in the y direction. Each resin recess 86 is connected to the resin reverse surface 82 and a resin first side surface 83. In the manufacturing process, the resin recesses 86 are formed by half-cut dicing in the second trench forming step, which will be described later.

Next, one example of a method for manufacturing the semiconductor device A2 will be described with reference to FIGS. 22 to 23. The manufacturing steps in common with those for the semiconductor device A1 of the first embodiment will not be described.

First, a lead frame 900 is prepared as shown in FIG. 22 (preparing step). The lead frame 900 has second trench forming regions S4 are determined for later processing. In FIG. 22, the second trench forming regions S4 are represented by the relatively lightly shaded regions extending in the x direction (the second removal regions S2) together with the darker shaded regions flanking the second removal regions S2. The second trench forming regions S4 are where trenches are to be formed on the reverse surface 902 in the second trench forming step, which will be described later. The second trench forming regions S4 are determined to select the regions of the lead frame 900, elongated in the x direction between the adjacent regions where the semiconductor devices A2 are to be formed. The second trench forming regions S4 have a width (y-direction dimension) greater than the second removal regions S2. Each second trench forming region S4 contains a second removal region S2 in the widthwise center. In other words, each second removal region S2 is narrower than a second trench forming region S4 and entirely overlaps with the second trench forming region S4.

Subsequently, a first plating layer 911 is formed to on all the surfaces of the lead frame (first plating step), semiconductor elements 6 are mounted on the lead frame 900 (mounting step), a sealing resin 920 is formed (resin forming step), and trenches 904 are formed (trench forming step). These manufacturing steps are similar to the manufacturing steps of the first embodiment.

Subsequently, trenches 905 are formed as shown in FIG. 23 (second trench forming step). In FIG. 23, the sealing resin 920 is shown in stippled form. The trenches 905 are formed at regions corresponding to the second trench forming regions S4 shown in FIG. 22 and hence extend in the x direction. Each trench 905 is recessed from the reverse surface 902 toward the obverse surface 901. As shown in FIG. 23, each trench 905 extends through both the lead frame 900 and the sealing resin 920. Each trench 905 has a bottom surface 905*a* and side surfaces 905*b*. The bottom surface 905*a* faces the same side as the reverse surface 902 of the lead frame 900. The side surfaces 905*b* connect the bottom surface 905*a* to the reverse surface 902 of the lead frame 900 and also to the surface of the sealing resin 920 facing the same side as the reverse surface 902. The trenches 905 will form terminal-portion recesses 124 at the regions of the lead frame 900 where the terminal portions 120 of first leads 1 are to be formed. Similarly, the trenches 905 will form terminal-portion recesses 224 at the regions where the terminal portions 220 of second leads are to be formed. Similarly, the trenches 905 will form terminal-portion recesses 324 at the regions where the terminal portions 320 of third leads 3 are to be formed. Portions of the trenches 905 formed in the sealing resin 920 will form resin recesses 86.

Similarly to the trench forming step, the second trench forming step is carried out by half-cut dicing of cutting the reverse surface 902 of the lead frame 900 with a first blade 951. In the half-cut dicing, portions of the lead frame 900 are removed from the reverse surface 902 at regions corresponding to the second trench forming regions S4 shown in FIG. 22. In the half-cut dicing, the lead frame 900 is cut partway in the z direction. In the illustrated example, the cutting depth is at least one half, such as about three quarters, of the thickness (z-direction dimension) of the lead frame 900. Since the reverse surface 902 of the lead frame 900 is coated with the first plating layer 911, formation of burrs resulting from cutting the lead frame 900 is reduced. In the second trench forming step, the trenches 905 may be formed by a process other than half-cut dicing with a blade.

Subsequently, a second plating layer 912 is formed (second plating step), a protective tape 970 is attached, and the lead frame 900 and the sealing resin 920 are cut along lines in the y direction (first cutting step). Subsequently, the lead frame 900 and the sealing resin 920 are cut along lines in the x direction (second cutting step). These manufacturing steps are similar to the manufacturing steps of the first embodiment.

The manufacturing process for the semiconductor device A2 includes two plating steps, namely the first plating step and the second plating step. As such, the manufacturing process is simplified as compared with the manufacturing of a conventional semiconductor device requiring three plating steps. In addition, since the first plating step is performed to form the first plating layer 911 on all the surfaces of the lead frame 900, masking is not necessary. This allows the manufacturing cost to be reduced as compared with the case where an Ag plating layer needs to be formed on the limited regions where bonding wires are to be bonded.

According to this embodiment, the first plating layer 911 is formed on the reverse surface 902 of the lead frame 900 in the first plating step. This ensures that formation of burrs resulting from cutting the lead frame 900 is reduced in the trench forming step and the second trench forming step. In second plating step, in addition, the second plating layer 912 is formed on the bottom surfaces 904*a* of the trenches 904 and the bottom surfaces 905*a* of the trenches 905. This ensures that formation of burrs resulting from cutting the lead frame 900 is reduced in the first cutting step and the second cutting step.

According to this embodiment, the first plating layer 911 is formed on the obverse surface 901 of the lead frame 900 in the first plating step. This provides the first plating layer 41 on the wire-bonding-portion obverse surfaces 211 and 311 to improve the adhesion to the bonding wires 71 and 72.

According to this embodiment, the second plating layer 42 is formed on the terminal-portion recesses 124, 224 and 324. Consequently, when the semiconductor device A2 is mounted on a circuit board, the second plating layer 42 will form solder fillets along the terminal-portion recesses 124, 224 and 324. This serves to increase the bonding strength of the semiconductor device A2 to the circuit board. In addition, the bonding state of the leads 1 to 3 to the circuit board can be easily determined by visual inspection.

Figure 24:
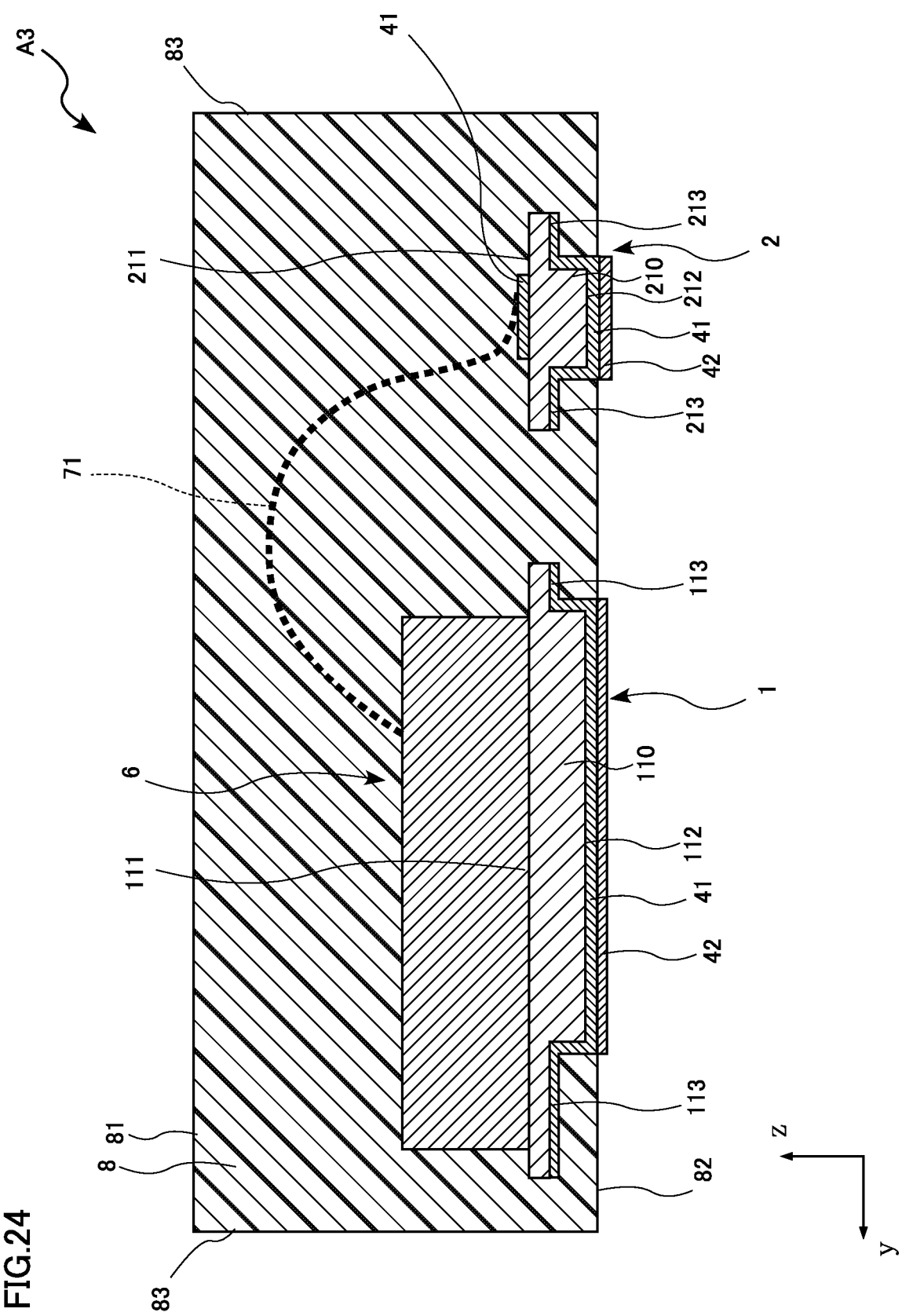
FIG. 24 is a sectional view of a semiconductor device according to a third embodiment.

With reference to FIG. 24, a semiconductor device A3 according to a third embodiment of the present disclosure will be described. In FIG. 24, the same or similar elements to those of the semiconductor device A1 described above are denoted by the same reference signs and an overlapping description will not be given. FIG. 24 is a sectional view of the semiconductor device A3 and corresponds to FIG. 7 of the first embodiment.

Unlike the semiconductor device A1 of the first embodiment, the first plating layer 41 the semiconductor device A3 shown in the figure is provided with the first plating layer 41 is formed on selected surfaces rather than the entire surfaces of the leads 1 to 3.

In the semiconductor device A3, the first lead 1 has the first plating layer 41 only on the mount-portion reverse surface 112, the mount-portion recesses 113, the terminal-portion reverse surfaces 122 and the connecting-portion reverse surfaces 132. That is, the first plating layer 41 is not formed on the mount-portion obverse surface 111, the terminal-portion obverse surfaces 121 and the connecting-portion obverse surfaces 131. Also, the second lead 2 has the first plating layer 41 only on the wire-bonding-portion reverse surface 212, the wire-bonding-portion recess 213, the terminal-portion reverse surface 222, and the connecting-portion reverse surfaces 232, in addition to the regions of the wire-bonding-portion obverse surface 211 where bonding wires 71 are to be bonded. Although not shown in FIG. 24, the third lead 3 has the first plating layer 41 only on the wire-bonding-portion reverse surface 312, the wire-bonding-portion recess 313, the terminal-portion reverse surface 322, and the connecting-portion reverse surface 332, in addition to the region of the wire-bonding-portion obverse surface 311 where a bonding wire 72 is to be bonded.

In the manufacturing process of the semiconductor device A3, the first plating step is performed to form a first plating layer 911 on the entire reverse surface 902 and all the surfaces of the recesses 903 of the lead frame 900. However, the obverse surface 901 of the lead frame 900 is masked so that the first plating layer 41 is formed only on the regions where the bonding wires 71 and 72 are to be bonded.

The semiconductor device A3 is manufactured by the processing steps including two plating steps, namely the first plating step and the second plating step. As such, the manufacturing process is simplified as compared with the manufacturing of a conventional semiconductor device requiring three plating steps.

According to this embodiment, the first plating layer 911 is formed on the reverse surface 902 of the lead frame 900 in the first plating step. This ensures that formation of burrs resulting from cutting the lead frame 900 is reduced in the trench forming step. In the second plating step, in addition, the second plating layer 912 is formed on the bottom surfaces 904*a* of the trenches 904. This ensures that formation of burrs resulting from cutting the lead frame 900 is reduced in the first cutting step. In the first plating step, in addition, the first plating layer 911 is also formed on the recesses 903 of the lead frame 900. This ensures that formation of burrs resulting from cutting the lead frame 900 is reduced in the second cutting step.

According to this embodiment, the first plating step is performed to form the first plating layer 911 on the obverse surface 901 of the lead frame 900 so as to cover only the limited regions. This provides the first plating layer 41 on the necessary regions of the wire-bonding-portion obverse surfaces 211 and 311 for bonding. This still ensures good adhesion to the bonding wires 71 and 72.

According to this embodiment, the second plating layer 42 is formed on the terminal-portion recesses 124, 224 and 324. Consequently, when the semiconductor device A3 is mounted on a circuit board, the second plating layer 42 will form solder fillets along the terminal-portion recesses 124, 224 and 324. This serves to increase the bonding strength of the semiconductor device A3 to the circuit board. In addition, the bonding state of the leads 1 to 3 to the circuit board can be easily determined by visual inspection.

According to this embodiment, the first plating layer 41 formed on the obverse surface 901 of the lead frame 900 so as to cover only the necessary regions for bonding. This can reduce the amount of material for plating.

Figure 25:
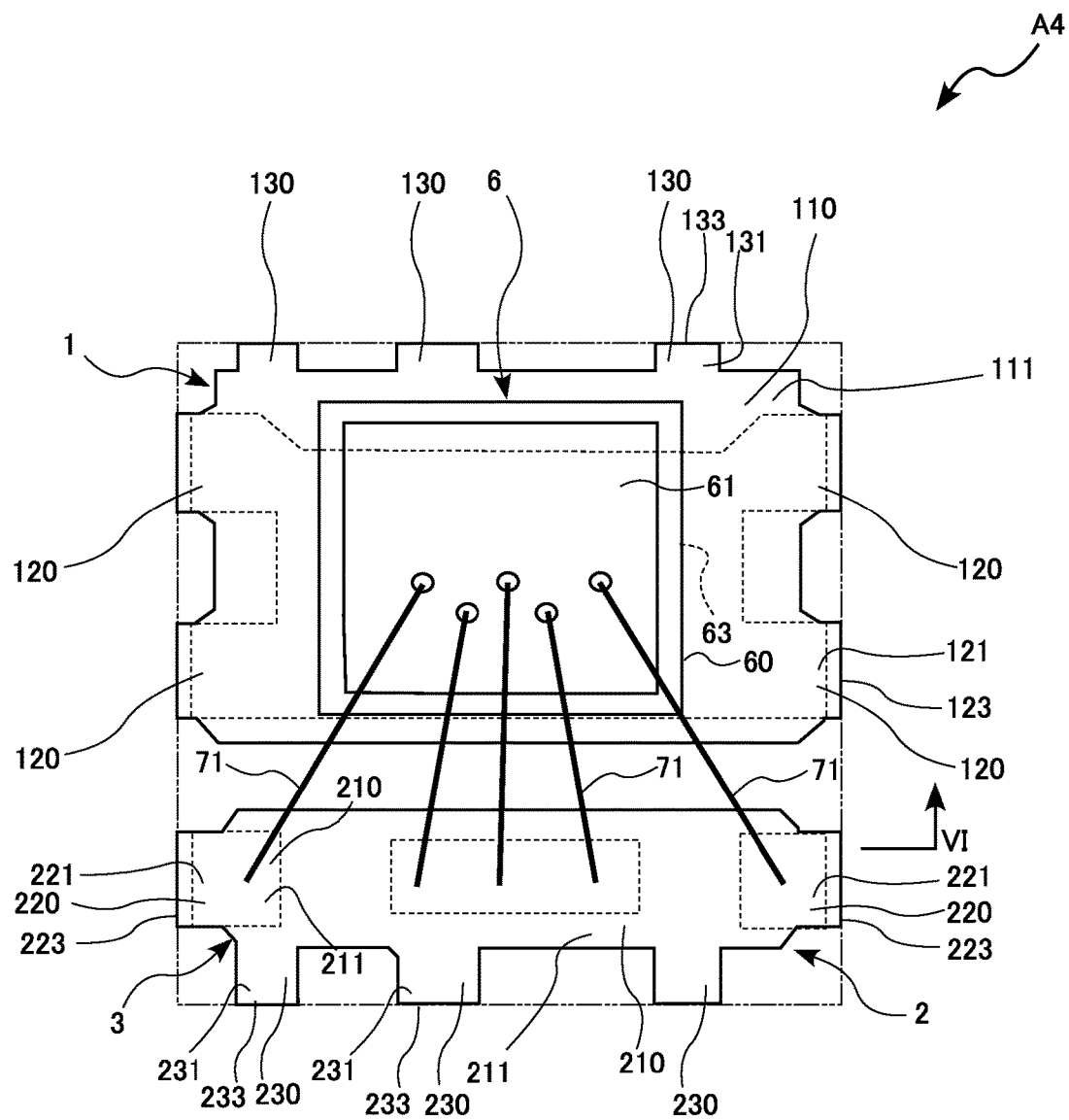
FIG. 25 is a plan of a semiconductor device according to a fourth embodiment.

With reference to FIG. 25, a semiconductor device A4 according to a fourth embodiment of the present disclosure will be described. In FIG. 25, the same or similar elements to those of the semiconductor device A1 described above are denoted by the same reference signs and an overlapping description will not be given. FIG. 25 is a plan view of the semiconductor device A4 and corresponds to FIG. 3 of the first embodiment. For convenience, FIG. 25 is shown through a sealing resin 8 and the outline of the sealing resin 8 is represented by imaginary lines (dash-double dot lines).

Unlike the semiconductor device A1 of the first embodiment, the semiconductor device A4 includes a semiconductor element 6 that is a diode.

The semiconductor device A4 does not include a third lead 3, and the second lead 2 extends in the x direction from one end to the other end of the semiconductor device A4 along an edge in the y direction (the lower edge in FIG. 25). Note, however, the shape, arrangement and number of second leads 2 to be provided are not limited to the example shown in the figure.

The diode (semiconductor element) 6 includes an element body 60, a first electrode 61 and a third electrode 63. The first electrode 61 is disposed on the surface of the element body 60 facing away from the first lead 1. The third electrode 63 is disposed on the surface of the element body 60 facing toward the first lead 1. In the illustrated example, the first electrode 61 is an anode, and the third electrode 63 is a cathode. With a non-illustrated electrically conductive bonding material, the diode 6 is bonded to the center of the mount-portion obverse surface 111 of the first lead 1, which is coated with the first plating layer 41. In this way, the third electrode 63 of the diode 6 is electrically connected to the first lead 1 through the electrically conductive bonding material. A plurality of bonding wires 71 are bonded to the first electrode 61 of the diode 6 and also to the wire-bonding-portion obverse surface 211 of the second lead 2, which is coated with the first plating layer 41. In this way, the first electrode 61 of the diode 6 is electrically connected to the second lead 2.

The semiconductor device A4 is manufactured by the processing steps including two plating steps, namely the first plating step and the second plating step. Consequently, the same advantages as the first embodiment are achieved.

The semiconductor device and the method for manufacturing a semiconductor device of the present disclosure are not limited to the embodiments described above. Various design changes are possible to the specific details of the semiconductor device and the method for manufacturing a semiconductor device of the present disclosure.

Clause 1.
A semiconductor device comprising:
a first lead having a first obverse surface and a first reverse surface facing opposite from each other in a thickness direction and formed with a first recess that is recessed from the first reverse surface toward the first obverse surface;
a semiconductor element mounted on the first obverse surface;
a sealing resin covering the semiconductor element;
a first plating layer formed in contact with the first obverse surface and the first reverse surface; and
a second plating layer,
wherein the first recess is exposed from the sealing resin,
the first plating layer includes a first portion covering the first reverse surface, and
the second plating layer is formed in contact with the first recess and the first portion.

Clause 2.
The semiconductor device according to Clause 1, wherein the first plating layer is configured to reduce burrs from forming when the first recess is formed.

Clause 3.
The semiconductor device according to Clause 1 or 2, wherein the first plating layer includes a first layer containing Ni and held in contact with the first lead.

Clause 4.
The semiconductor device according to Clause 3, wherein the first plating layer includes a second layer containing Au and held in contact with the second plating layer.

Clause 5.
The semiconductor device according to Clause 3 or 4, wherein the first plating layer includes a third layer containing Pd and held in contact with the first layer.

Clause 6.
The semiconductor device according to any one of Clauses 1 to 5, wherein the second plating layer is made of a material having higher solder wettability than a material of the first lead.

Clause 7.
The semiconductor device according to any one of Clauses 1 to 6, wherein the second plating layer contains Sn.

Clause 8.
The semiconductor device according to any one of Clauses 1 to 7, wherein the first lead contains Cu.

Clause 9.
The semiconductor device according to any one of Clauses 1 to 8, wherein the first lead has a second recess that is recessed from the first reverse surface toward the first obverse surface and covered by the sealing resin.

Clause 10.
The semiconductor device according to any one of Clauses 1 to 9, further comprising:
a second lead spaced apart from the first lead; and
a bonding wire,
wherein the second lead has a second obverse surface and a second reverse surface facing opposite from each other in the thickness direction and a first recess recessed from the second reverse surface toward the second obverse surface,
the bonding wire is connected to the semiconductor element and the second obverse surface,
the first recess of the second lead is exposed from the sealing resin,
the first plating layer includes a second portion covering the second reverse surface, and
the second plating layer is formed in contact with the first recess of the second lead and the second portion.

Clause 11.

The semiconductor device according to Clause 10, wherein the first plating layer is made of a material having higher adhesion to the bonding wire than a material of the first lead.

Clause 12.

The semiconductor device according to Clause 10 or 11, wherein the second lead has a second recess recessed from the second reverse surface toward the second obverse surface and covered by the sealing resin.

Clause 13.

A method for manufacturing a semiconductor device, the method comprising:

a preparing step of preparing a lead frame having an obverse surface and a reverse surface facing opposite from each other in a thickness direction;

a first plating step of forming a first plating layer on the obverse surface and the reverse surface;

a mounting step of mounting a semiconductor element on the obverse surface;

a resin forming step of covering the semiconductor element with a sealing resin;

a trench forming step of forming a trench by cutting the lead frame partway in the thickness direction from the reverse surface;

a second plating step of forming a second plating layer on the reverse surface and the trench; and a cutting step of cutting the lead frame and the sealing resin along the trench by removing entire portions of the lead frame and the sealing resin that overlap with a removal region as viewed in the thickness direction, where the removal region is narrower than the trench and entirely overlapping with the trench as viewed in the thickness direction.

Clause 14.

The method according to Clause 13, wherein the trench forming step includes forming the trench by half-cut dicing with a first blade, and the cutting step includes cutting to remove the portion by full-cut dicing with a second blade that is thinner than the first blade.

Clause 15.

The method according to Clause 13 or 14, wherein the trench forming step includes forming a first trench extending in a first direction that is perpendicular to the thickness direction and forming a second trench that is perpendicular to the first trench.

Clause 16.

The method according to Clause 15, wherein the cutting step includes a first cutting step of removing a first removal region extending along the first trench and a second cutting step of removing a second removal region extending along the second trench.

REFERENCE SIGN LIST

A1 to A4: Semiconductor Device
1: First Lead
110: Mount Portion
111: Mount-Portion Obverse Surface
112: Mount-Portion Reverse Surface
113: Mount-Portion Recess
120: Terminal Portion
121: Terminal-Portion Obverse Surface
122: Terminal-Portion Reverse Surface
123: Terminal-Portion End Surface
124: Terminal-Portion Recess
130: Connecting Portion
131: Connecting-Portion Obverse Surface
132: Connecting-Portion Reverse Surface
133: Connecting-Portion End Surface
2: Second Lead
210: Wire Bonding Portion
211: Wire-Bonding-Portion Obverse Surface
212: Wire-Bonding-Portion Reverse Surface
213: Wire-Bonding-Portion Recess
220: Terminal Portion
221: Terminal-Portion Obverse Surface
222: Terminal-Portion Reverse Surface
223: Terminal-Portion End Surface
224: Terminal-Portion Recess
230: Connecting Portion
231: Connecting-Portion Obverse Surface
232: Connecting-Portion Reverse Surface
233: Connecting-Portion End Surface
3: Third Lead
310: Wire Bonding Portion
311: Wire-Bonding-Portion Obverse Surface
312: Wire-Bonding-Portion Reverse Surface
313: Wire-Bonding-Portion Recess
320: Terminal Portion
321: Terminal-Portion Obverse Surface
322: Terminal-Portion Reverse Surface
323: Terminal-Portion End Surface
324: Terminal-Portion Recess
330: Connecting Portion
331: Connecting-Portion Obverse Surface
332: Connecting-Portion Reverse Surface
333: Connecting-Portion End Surface
41: First Plating Layer
411: Ni Plating Layer
412: Pd Plating Layer
413: Au Plating Layer
42: Second Plating Layer
6: Semiconductor Element
60: Element Body
61: First Electrode
62: Second Electrode
63: Third Electrode
71, 72: Bonding Wire
8: Sealing Resin
81: Resin Obverse Surface
82: Resin Reverse Surface
83: Resin First Side Surface
84: Resin Second Side Surface
85, 86: Resin Recess
900: Lead Frame
901: Obverse Surface
902: Reverse Surface
903: Recess
904: Trench
904a: Bottom Surface
904b: Side Surface
905: Trench
905a: Bottom Surface
905b: Side Surface
906: Through Hole
911: First Plating Layer
912: Second Plating Layer
920: Sealing Resin
951: First Blade
952: Second Blade
970: Protective Tape
S1: First Removal Region S2: Second Removal Region
S3: Trench Forming Region
S4: Second Trench Forming Region

The invention claimed is:
1. A semiconductor device comprising:
a first lead having a first obverse surface, a first reverse surface facing opposite from the first obverse surface in a thickness direction, and a first end surface that is perpendicular to the first obverse surface and the first reverse surface and is connected to the first obverse surface, the first lead being formed with a first recess and a second recess that are each recessed from the first reverse surface toward the first obverse surface;
a second lead spaced apart from the first lead and having a second obverse surface and a second reverse surface facing opposite from each other in the thickness direction, and a second end surface that is perpendicular to the second obverse surface and the second reverse surface and is connected to the second obverse surface;
a semiconductor element mounted on the first obverse surface;
a sealing resin covering the semiconductor element and having a resin side surface extending along the thickness direction;
a first plating layer formed in contact with the first reverse surface and continuously covering an inner surface of the second recess; and
a second plating layer,
wherein the first recess is exposed from the sealing resin and is connected to the first reverse surface and the first end surface,
the first plating layer includes a first portion covering the first reverse surface,
the second plating layer is formed in contact with the first recess and the first portion,
the second plating layer on the first recess includes a first part extending along the thickness direction and a second part extending along a direction perpendicular to the thickness direction,
the first end surface is aligned with the resin side surface,
the first reverse surface, the second reverse surface, the first end surface, and the second end surface are exposed from the sealing resin, and
the first plating layer is not formed on the first obverse surface.

2. The semiconductor device according to claim 1, wherein the first plating layer is configured to reduce burrs from forming when the first recess is formed.

3. The semiconductor device according to claim 1, wherein the first plating layer includes a first layer containing Ni and held in contact with the first lead.

4. The semiconductor device according to claim 3, wherein the first plating layer includes a second layer containing Au and held in contact with the second plating layer.

5. The semiconductor device according to claim 3, wherein the first plating layer includes a third layer containing Pd and held in contact with the first layer.

6. The semiconductor device according to claim 1, wherein the second plating layer is made of a material having higher solder wettability than a material of the first lead.

7. The semiconductor device according to claim 1, wherein the second plating layer contains Sn.

8. The semiconductor device according to claim 1, wherein the first lead contains Cu.

9. The semiconductor device according to claim 1, wherein the second recess is covered by the sealing resin.

10. The semiconductor device according to claim 1, further comprising:
a bonding wire,
wherein the second lead has a first recess recessed from the second reverse surface toward the second obverse surface,
the bonding wire is connected to the semiconductor element,
the first recess of the second lead is exposed from the sealing resin,
the first plating layer includes a second portion covering the second reverse surface, and
the second plating layer is formed in contact with the first recess of the second lead and the second portion.

11. The semiconductor device according to claim 10, wherein the first plating layer is made of a material having adhesion to the bonding wire, and
adhesion between the first plating layer and the bonding wire is stronger than adhesion between the first lead and the bonding wire.

12. The semiconductor device according to claim 10, wherein the second lead has a second recess recessed from the second reverse surface toward the second obverse surface and covered by the sealing resin.

13. A method for manufacturing a semiconductor device, the method comprising:
a preparing step of preparing a lead frame having an obverse surface and a reverse surface facing opposite from each other in a thickness direction, the lead frame being formed with a recess that is recessed from the reverse surface toward the obverse surface;
a first plating step of forming a first plating layer on the reverse surface and an inner surface of the recess but not on the obverse surface;
a mounting step of mounting a semiconductor element on the obverse surface;
a resin forming step of covering the semiconductor element with a sealing resin so that the reverse surface is not covered with the sealing resin;
a trench forming step of forming a trench by cutting the lead frame partway in the thickness direction from the reverse surface so that a part of the lead frame in the thickness direction remains;
a second plating step of forming a second plating layer on the reverse surface and the trench; and
a cutting step of cutting the lead frame and the sealing resin along the trench by removing entire portions of the lead frame and the sealing resin that overlap with a removal region as viewed in the thickness direction, the removal region being narrower than the trench and entirely overlapping with the trench as viewed in the thickness direction so that the second plating layer on the trench is formed to include a first part extending along the thickness direction and a second part extending along a direction perpendicular to the thickness direction, the sealing resin being formed to include a resin side surface extending along the thickness direction, and the lead frame being formed into at least a first lead and a second lead, the first lead including a first end surface that is aligned with the resin side surface and is exposed from the sealing resin, the second lead including a second end surface that is exposed from the sealing resin.

14. The method according to claim 13, wherein the trench forming step includes forming the trench by half-cut dicing with a first blade, and the cutting step includes cutting to remove the portion by full-cut dicing with a second blade that is thinner than the first blade.

15. The method according to claim 13, wherein the trench forming step includes forming a first trench extending in a first direction that is perpendicular to the thickness direction and forming a second trench that is perpendicular to the first trench.

16. The method according to claim 15, wherein the cutting step includes a first cutting step of removing a first removal region extending along the first trench and a second cutting step of removing a second removal region extending along the second trench.

17. The semiconductor device according to claim 10, wherein the first plating layer includes a third portion provided on a portion of the second obverse surface and is not provided on other portions of the second obverse surface, the bonding wire is bonded to the third portion.

\* \* \* \* \*